United States Patent
Yoon et al.

(10) Patent No.: US 12,408,515 B2
(45) Date of Patent: Sep. 2, 2025

(54) DISPLAY APPARATUS

(71) Applicant: SAMSUNG DISPLAY CO., LTD., Yongin-si (KR)

(72) Inventors: Seontae Yoon, Yongin-si (KR); Youngmin Kim, Yongin-si (KR); Junghyun Kwon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 515 days.

(21) Appl. No.: 17/817,156

(22) Filed: Aug. 3, 2022

(65) Prior Publication Data

US 2023/0200138 A1  Jun. 22, 2023

(30) Foreign Application Priority Data

Dec. 22, 2021 (KR) ......................... 10-2021-0185420

(51) Int. Cl.
*H10K 59/122* (2023.01)
*H10K 59/127* (2023.01)
*H10K 59/38* (2023.01)
*H10K 59/80* (2023.01)

(52) U.S. Cl.
CPC ........... *H10K 59/122* (2023.02); *H10K 59/38* (2023.02); *H10K 59/127* (2023.02); *H10K 59/875* (2023.02)

(58) Field of Classification Search
None
See application file for complete search history.

(56) References Cited

U.S. PATENT DOCUMENTS

| | | | |
|---|---|---|---|
| 10,371,875 B2 | 8/2019 | Kim et al. | |
| 2009/0200931 A1* | 8/2009 | Takei | H10K 59/127 313/504 |
| 2010/0013383 A1* | 1/2010 | Kim | H10K 59/80517 345/206 |
| 2014/0353630 A1* | 12/2014 | Baek | H10K 50/8428 257/40 |
| 2018/0190740 A1* | 7/2018 | Bang | H10K 50/13 |
| 2019/0251318 A1* | 8/2019 | Jung | G06V 40/1306 |

(Continued)

FOREIGN PATENT DOCUMENTS

| KR | 1020200104451 A | 9/2020 |
|---|---|---|
| KR | 1020210005402 A | 1/2021 |

(Continued)

*Primary Examiner* — Scott B Geyer
(74) *Attorney, Agent, or Firm* — CANTOR COLBURN LLP

(57) ABSTRACT

A display apparatus includes a pixel-defining layer defining a pixel opening exposing a central portion of a pixel electrode; an opposite electrode disposed over the pixel-defining layer; a bank over the opposite electrode and defining a bank opening overlapping the pixel opening; and a filter-defining layer disposed over the bank and defining a filter opening overlapping the pixel opening. A distance between an upper surface of a portion of the opposite electrode overlapping the pixel opening and a lower surface of the quantum dot layer or the light-transmitting layer is defined as a first distance, a distance between an edge of the filter opening and an edge of the pixel opening in the plan view is defined as a second distance, and a ratio of the second distance to the first distance is greater than or equal to 0.625 and less than or equal to 1.

24 Claims, 12 Drawing Sheets

(56) References Cited

U.S. PATENT DOCUMENTS

| | | | |
|---|---|---|---|
| 2020/0219935 A1* | 7/2020 | Ahn ..................... | H10K 59/122 |
| 2020/0273929 A1* | 8/2020 | Kim ..................... | H10K 59/35 |
| 2020/0381484 A1* | 12/2020 | Choe ................... | H10K 50/858 |
| 2021/0005671 A1 | 1/2021 | Kim et al. | |
| 2021/0050388 A1 | 2/2021 | Song | |
| 2021/0074770 A1* | 3/2021 | Choe ..................... | G02B 5/206 |
| 2021/0134906 A1* | 5/2021 | Lee ..................... | H10K 50/865 |
| 2021/0143358 A1 | 5/2021 | Son et al. | |
| 2021/0202868 A1* | 7/2021 | Paek ..................... | H10K 50/841 |
| 2021/0359274 A1* | 11/2021 | Kim ..................... | H10K 50/858 |
| 2022/0077256 A1* | 3/2022 | Lim ..................... | H10K 59/40 |
| 2023/0012798 A1* | 1/2023 | Lee ..................... | H10K 59/38 |

FOREIGN PATENT DOCUMENTS

| | | |
|---|---|---|
| KR | 1020210021216 A | 2/2021 |
| KR | 1020210060707 A | 5/2021 |

\* cited by examiner

DISPLAY APPARATUS

This application claims priority to Korean Patent Application No. 10-2021-0185420, filed on Dec. 22, 2021, and all the benefits accruing therefrom under 35 U.S.C. § 119, the content of which in its entirety is herein incorporated by reference.

BACKGROUND

1. Field

One or more embodiments relate to a display apparatus, and more particularly, to a display apparatus in which a high-quality image may be displayed.

2. Description of the Related Art

A display apparatus has a plurality of pixels. In a full-color display apparatus, the plurality of pixels may emit light of different colors. At least some of the pixels of the display apparatus have a color conversion unit to emit light of different colors. Accordingly, light of a first color generated by a light-emitting unit of some pixels is converted into light of a second color while passing through a corresponding color conversion unit, and then is extracted to the outside.

SUMMARY

A conventional display apparatus including a color conversion unit may not display a high-quality image due to the low light efficiency thereof.

One or more embodiments include a display apparatus in which a high-quality image may be displayed.

According to an embodiment, a display apparatus includes a first substrate, a pixel electrode disposed over the first substrate, a pixel-defining layer which covers an edge of the pixel electrode, where a pixel opening is defined through the pixel-defining layer to expose a central portion of the pixel electrode, an emission layer disposed over the pixel electrode, where the emission layer emits light having a wavelength in a first wavelength band, an opposite electrode disposed over the emission layer, a second substrate disposed over the first substrate with the opposite electrode therebetween, a bank disposed on a lower surface of the second substrate, where a bank opening, which overlaps the pixel opening and has an area greater than an area of the pixel opening when viewed from a direction perpendicular to the first substrate, is defined through the bank, a quantum dot layer or a light-transmitting layer disposed in the bank opening defined by the bank, and a filter-defining layer disposed between the bank and the second substrate, where a filter opening, which overlaps the pixel opening and has an area greater than the area of the pixel opening when viewed from the direction perpendicular to the first substrate, is defined through the filter-defining layer. In such an embodiment, a distance between an upper surface of a portion of the opposite electrode overlapping the pixel opening in the direction perpendicular to the first substrate and a lower surface of the quantum dot layer or the light-transmitting layer in the direction to perpendicular to the first substrate is defined as a first distance, a distance between an edge of the filter opening and an edge of the pixel opening when viewed from the direction perpendicular to the first substrate is defined as a second distance, and a ratio of the second distance to the first distance is greater than or equal to 0.625 and less than or equal to 1.

In an embodiment, the second distance may be constant along the edge of the pixel opening.

In an embodiment, the second distance may be greater than or equal to about 5 micrometers (μm) and less than or equal to about 8 μm.

In an embodiment, the area of the bank opening when viewed from the direction perpendicular to the first substrate may be greater than or equal to an area of the filter opening.

In an embodiment, a distance between an edge of the bank opening and the edge of the pixel opening when viewed from the direction perpendicular to the first substrate is defined as a third distance, and a ratio of the third distance to the first distance may be greater than or equal to 0.75 and less than or equal to 1.25.

In an embodiment, the third distance may be constant along the edge of the pixel opening.

In an embodiment, the third distance may be greater than or equal to about 6 μm and less than or equal to about 10 μm.

In an embodiment, the area of the bank opening when viewed from the direction perpendicular to the first substrate may be greater than the area of the filter opening.

In an embodiment, a distance between an edge of the bank opening and the edge of the pixel opening when viewed from the direction perpendicular to the first substrate is defined as a third distance, and a ratio of the third distance to the first distance may be greater than 0.75 and less than or equal to 1.25.

In an embodiment, the third distance may be constant along the edge of the pixel opening.

In an embodiment, the third distance may be greater than about 6 μm and less than or equal to about 10 μm.

In an embodiment, the quantum dot layer may convert the light having the wavelength in the first wavelength band into light having a wavelength in a second wavelength band.

In an embodiment, the display apparatus may further include a color filter layer which fills the filter opening and allows the light having the wavelength in the second wavelength band to pass therethrough.

In an embodiment, the ratio of the second distance to the first distance may be greater than or equal to about 0.75 and less than or equal to about 1.

In an embodiment, the second distance may be greater than or equal to about 6 μm and less than or equal to about 8 μm.

According to an embodiment, a display apparatus includes a first substrate, a pixel electrode disposed over the first substrate, a pixel-defining layer which covers an edge of the pixel electrode, where a pixel opening is defined through the pixel-defining layer to expose a central portion of the pixel electrode, an emission layer disposed over the pixel electrode, where the emission layer emits light having a wavelength in a first wavelength band, an opposite electrode disposed over the emission layer, a second substrate disposed over the first substrate with the opposite electrode therebetween, a bank disposed on a lower surface of the second substrate in a direction to the first substrate, where a bank opening, which overlaps the pixel opening and has an area greater than an area of the pixel opening when viewed from a direction perpendicular to the first substrate, is defined through the bank, and a filter-defining layer disposed between the bank and the second substrate, where a filter opening, which overlaps the pixel opening and has an area greater than the area of the pixel opening when viewed from the direction perpendicular to the first substrate, is defined through the filter-defining layer. In such an embodiment, a distance between an edge of the filter opening and an edge of the pixel opening when viewed from the direction perpendicular to the first substrate is greater than or equal to about 5 μm and less than or equal to about 8 μm.

In an embodiment, the distance between the edge of the filter opening and the edge of the pixel opening may be constant along the edge of the pixel opening.

In an embodiment, the area of the bank opening when viewed from the direction perpendicular to the first substrate may be greater than or equal to the area of the filter opening.

In an embodiment, a distance between an edge of the bank opening and the edge of the pixel opening when viewed from the direction perpendicular to the first substrate may be greater than or equal to about 6 μm and less than or equal to about 10 μm.

In an embodiment, the distance between the edge of the bank opening and the edge of the pixel opening may be constant along the edge of the pixel opening.

In an embodiment, the area of the bank opening when viewed from the direction perpendicular to the first substrate may be greater than the area of the filter opening.

In an embodiment, a distance between an edge of the bank opening and the edge of the pixel opening when viewed from the direction perpendicular to the first substrate may be greater than about 6 μm and less than or equal to about 10 μm.

In an embodiment, the distance between the edge of the bank opening and the edge of the pixel opening may be constant along the edge of the pixel opening.

In an embodiment, the distance between the edge of the filter opening and the edge of the pixel opening may be greater than or equal to about 6 μm and less than or equal to about 8 μm.

BRIEF DESCRIPTION OF THE DRAWINGS

The above and other features of certain embodiments will be more apparent from the following description taken in conjunction with the accompanying drawings, in which.

DETAILED DESCRIPTION

Figure 1:
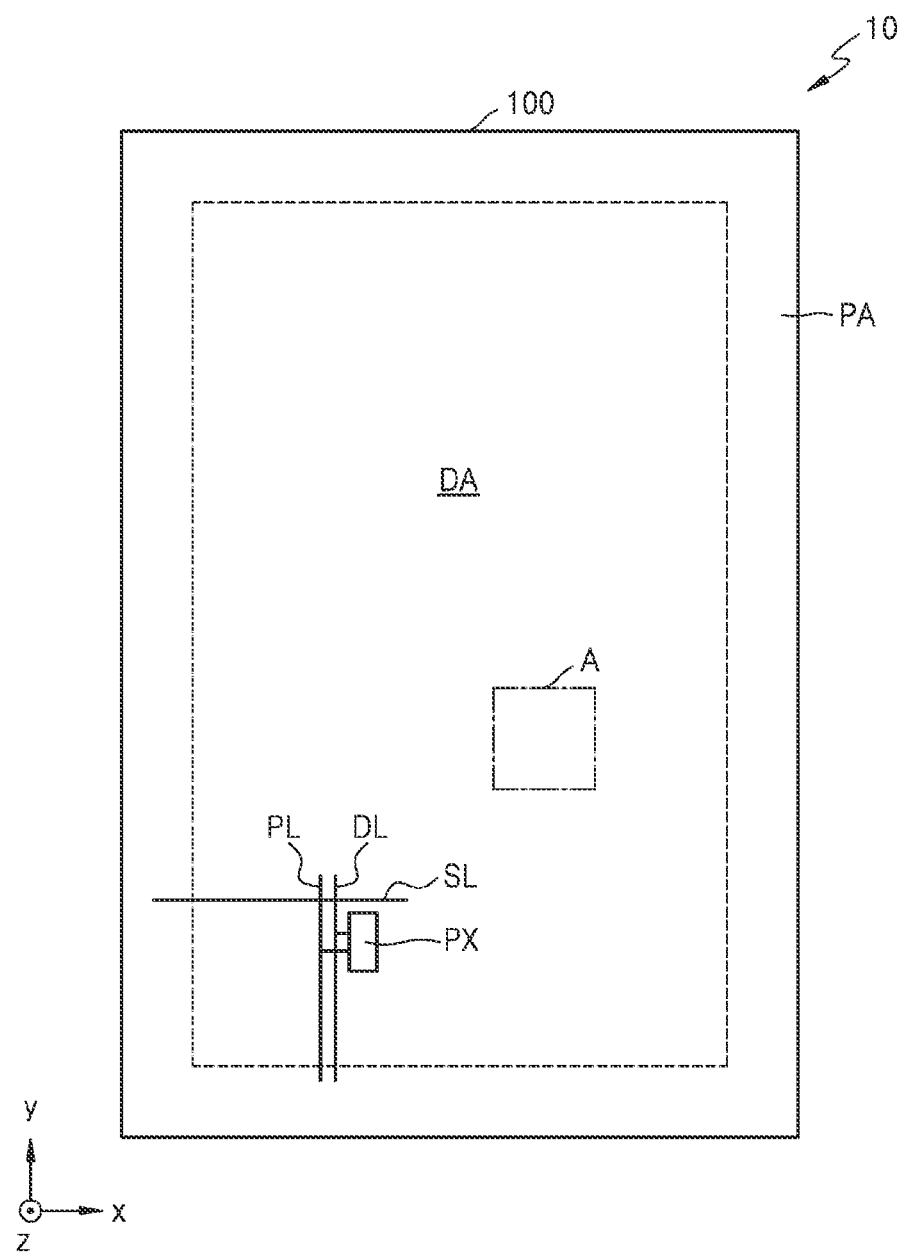
FIG. 1 is a plan view schematically illustrating a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Sizes of elements in the drawings may be exaggerated or reduced for convenience of description. In other words, since sizes and thicknesses of components in the drawings are arbitrarily illustrated for convenience of explanation, the following embodiments are not limited thereto.

In the following embodiments, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is a plan view schematically illustrating a display apparatus according to an embodiment. As shown in FIG. 1, an embodiment of the display apparatus includes a display panel 10. The display apparatus may be any display apparatus that includes the display panel 10. Embodiments of the display apparatus may include various apparatuses, such as smartphones, tablet personal computers ("PC"s), laptop PCs, televisions, or advertisement boards, for example.

The display panel 10 may include a display area DA and a peripheral area PA located outside the display area DA. In an embodiment, as shown in FIG. 1, the display area DA has a rectangular shape. However, the disclosure is not limited thereto. In an alternative embodiment, for example, the display area DA may have various shapes, such as a circle, an ellipse, a polygon, and a particular figure.

The display area DA is an area in which an image is displayed, and a plurality of pixels PX may be arranged therein. Each of the pixels PX may include a display element, such as an organic light-emitting diode. In an embodiment, for example, each of the pixels PX may emit red, green, or blue light. The pixels PX may be connected to a pixel circuit including a thin-film transistor, a storage capacitor, etc. The pixel circuit may be connected to a scan line SL configured to transmit a scan signal, a data line DL, which crosses the scan line SL and is configured to transmit a data signal, and a driving voltage line PL configured to apply a driving voltage. The scan line SL may extend in an x direction, and the data line DL and the driving voltage line PL may each extend in a y direction.

The pixels PX may emit light having a brightness corresponding to an electronic signal from the pixel circuit electrically connected thereto. An image may be displayed in the display area DA through the light emitted from the pixels PX. In an embodiment, for example, the pixel PX may be defined as an area in which any of red, green, and blue light is emitted, as described above.

The peripheral area PA is an area in which the pixels PX are not arranged, and may be an area in which no image is displayed. A power supply line or the like for driving the pixels PX may be located in the peripheral area PA. In addition, a printed circuit board including a driving circuit unit or a terminal unit to which a driver integrated circuit ("IC") is connected may be arranged in the peripheral area PA.

In an embodiment, where the display panel 10 may include a first substrate 100, the first substrate 100 may include the display area DA and the peripheral area PA.

Figure 2:
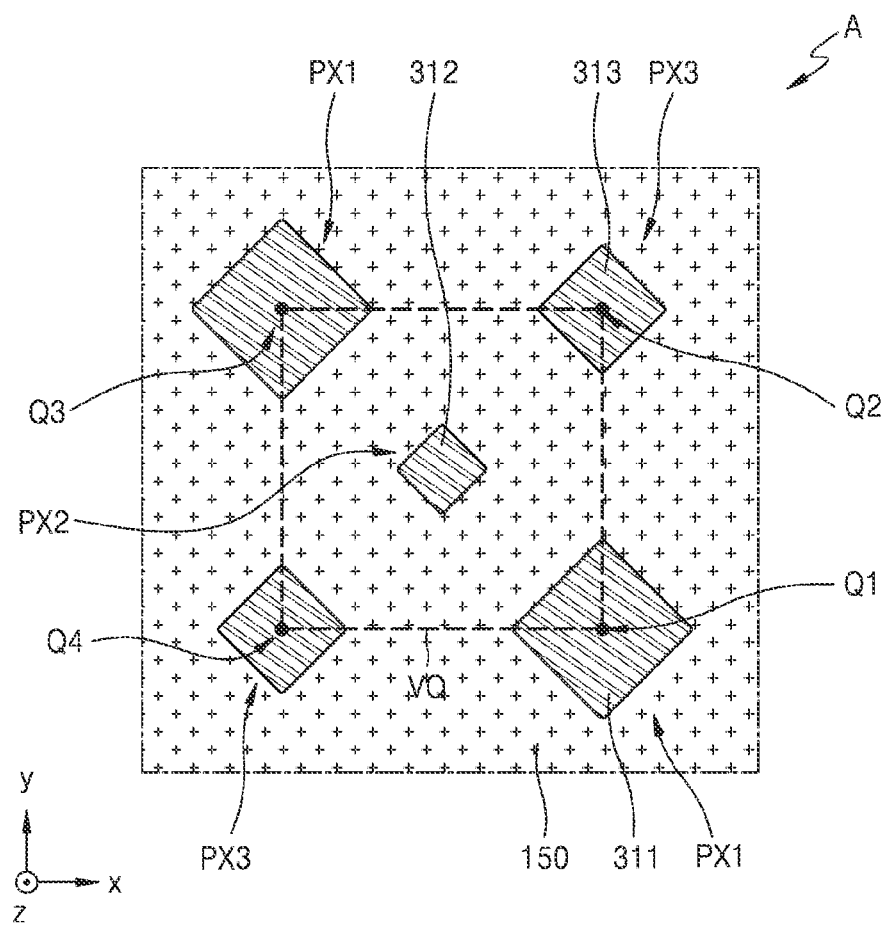
FIG. 2 is a plan view schematically illustrating a portion of a display apparatus according to an embodiment.

FIG. 2 is a plan view schematically illustrating a portion of a display apparatus according to an embodiment. FIG. 2 may be an enlarged plan view of region A of FIG. 1.

FIGS. 3 to 6 are plan views schematically illustrating a portion of a display apparatus according to alternative embodiments.

As shown in FIG. 2, an embodiment of the display apparatus may include a plurality of pixels. The pixels may include a first pixel PX1, a second pixel PX2, and a third pixel PX3, which emit light of different colors from each other. The first pixel PX1 may be a pixel that emits a blue light, the second pixel PX2 may be a pixel that emits a red light, and the third pixel PX3 may be a pixel that emits a green light.

Each of the first pixel PX1, the second pixel PX2, and the third pixel PX3 may have a polygonal shape when viewed from a direction (a z-axis direction) perpendicular to the first substrate 100. In an embodiment, as shown in FIG. 2, each of the first pixel PX1, the second pixel PX2, and the third pixel PX3 has a rectangular shape, for example, a rectangular shape with round edges, when viewed from the direction (the z-axis direction) perpendicular to the first substrate 100. However, the disclosure is not limited thereto. In an alternative embodiment, for example, each of the first pixel PX1, the second pixel PX2, and the third pixel PX3 may also have a circular shape or an elliptical shape when viewed from the direction (the z-axis direction) perpendicular to the first substrate 100. In an embodiment, when viewed from the direction (the z-axis direction) perpendicular to the first substrate 100, the shapes of the first pixel PX1, the second pixel PX2, and the third pixel PX3 may be respectively defined by a first color filter layer 810, a second color filter layer 820, and/or a third color filter layer 830, which are described in detail below with reference to FIG.

Sizes, that is, areas, of the first pixel PX1, the second pixel PX2, and the third pixel PX3 may be different from each other. In an embodiment, for example, an area of the second pixel PX2 may be less than an area of the first pixel PX1 and an area of the third pixel PX3. However, the disclosure is not limited thereto. In an embodiment, for example, the areas of the first pixel PX1, the second pixel PX2, and the third pixel PX3 may be substantially equal to each other. In such an embodiment, when viewed from the direction (the z-axis direction) perpendicular to the first substrate 100, the areas of the first pixel PX1, the second pixel PX2, and the third pixel PX3 may be respectively defined by the first color filter layer 810, the second color filter layer 820, and/or the third color filter layer 830, which are described in detail below with reference to FIG. 7.

The first pixel PX1 may include a first pixel electrode 311, the second pixel PX2 may include a second pixel electrode 312, and the third pixel PX3 may include a third pixel electrode 313. A pixel-defining layer 150 may cover an edge of each of the first pixel electrode 311, the second pixel electrode 312, and the third pixel electrode 313. In an embodiment, the pixel-defining layer 150 may have or define a pixel opening exposing a center of the first pixel electrode 311, a pixel opening exposing a center of the second pixel electrode 312, and a pixel opening exposing a center of the third pixel electrode 313, that is, a pixel opening exposing a center of the first pixel electrode 311, a pixel opening exposing a center of the second pixel electrode 312, and a pixel opening exposing a center of the third pixel electrode 313 are defined through the pixel-defining layer 150.

Figure 5:
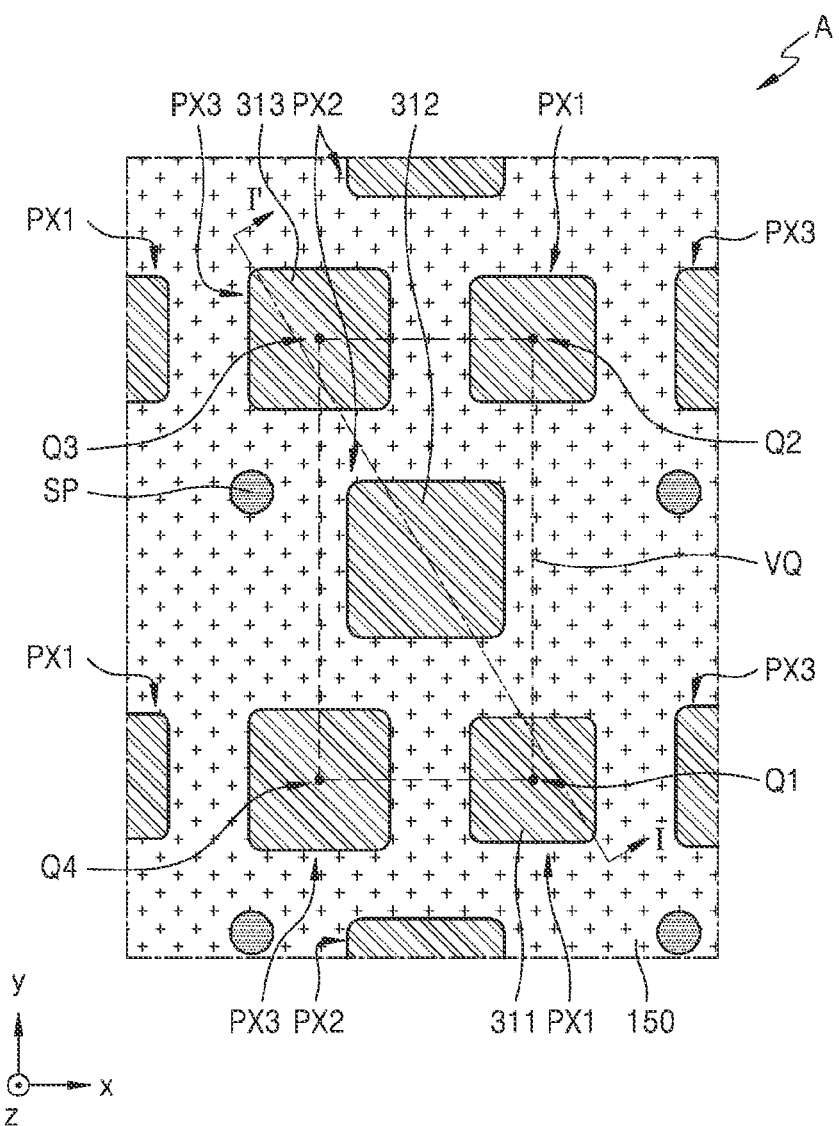
FIG. 5 is a plan view schematically illustrating a portion of a display apparatus according to another alternative embodiment.
Figure 6:
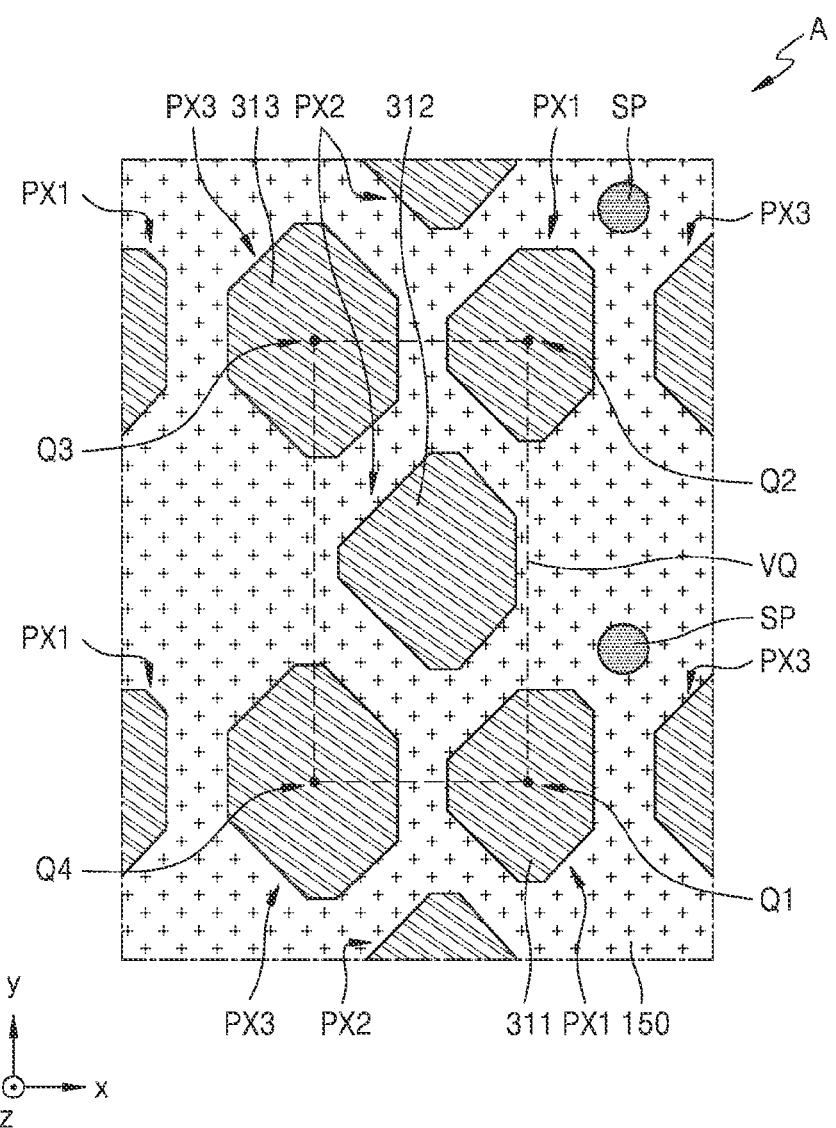
FIG. 6 is a plan view schematically illustrating a portion of a display apparatus according to another alternative embodiment.

In an embodiment, as shown in FIGS. 5 and 6, a column spacer SP may be disposed over the pixel-defining layer 150. The column spacer SP may substantially constantly maintain a distance between a stacked body or structure on the first substrate 100 and a stacked body or structure on a second substrate 900 (see FIG. 7).

The first pixel PX1 may include a light-transmitting layer 610 (see FIG. 7) over the first pixel electrode 311, the second pixel PX2 may include a first quantum dot layer 620 (see FIG. 7) over the second pixel electrode 312, and the third pixel PX3 may include a second quantum dot layer 630 (see FIG. 7) over the third pixel electrode 313. In FIG. 2, the light-transmitting layer 610, the first quantum dot layer 620, and the second quantum dot layer 630 are omitted, for convenience. These layers are described in detail below.

In an embodiment, the first pixel PX1, the second pixel PX2, and the third pixel PX3 may be arranged in a PenTile™ structure. In such an embodiment, in an imaginary quadrangle VQ having a center of the second pixel PX2 as a center thereof, where the first pixel PX1 may be arranged at a first vertex Q1 thereof, and the third pixel PX3 may be arranged at a second vertex Q2 thereof neighboring the first vertex Q1. In such an embodiment, the first pixel PX1 may be arranged at a third vertex Q3 of the imaginary quadrangle VQ, which is positioned symmetrical to the first vertex Q1 with respect to the center of the imaginary quadrangle VQ, and the third pixel PX3 may be arranged at a fourth vertex Q4 of the imaginary quadrangle VQ, which is positioned symmetrical to the second vertex Q2 with respect to the center of the imaginary quadrangle VQ. The imaginary quadrangle VQ may have a square shape. The first pixel PX1 and the third pixel PX3 may be alternately arranged with each other in an x-axis direction and a y-axis direction crossing the x-axis direction. In such an embodiment, a set of first pixels PX1, second pixels PX2, and third pixels PX3 arranged as shown in FIG. 2 may be repeatedly arranged in the x-axis direction, and may also be repeatedly arranged in the y-axis direction. Accordingly, the first pixel PX1 may be surrounded by the second pixels PX2 and the third pixels PX3.

Figure 3:
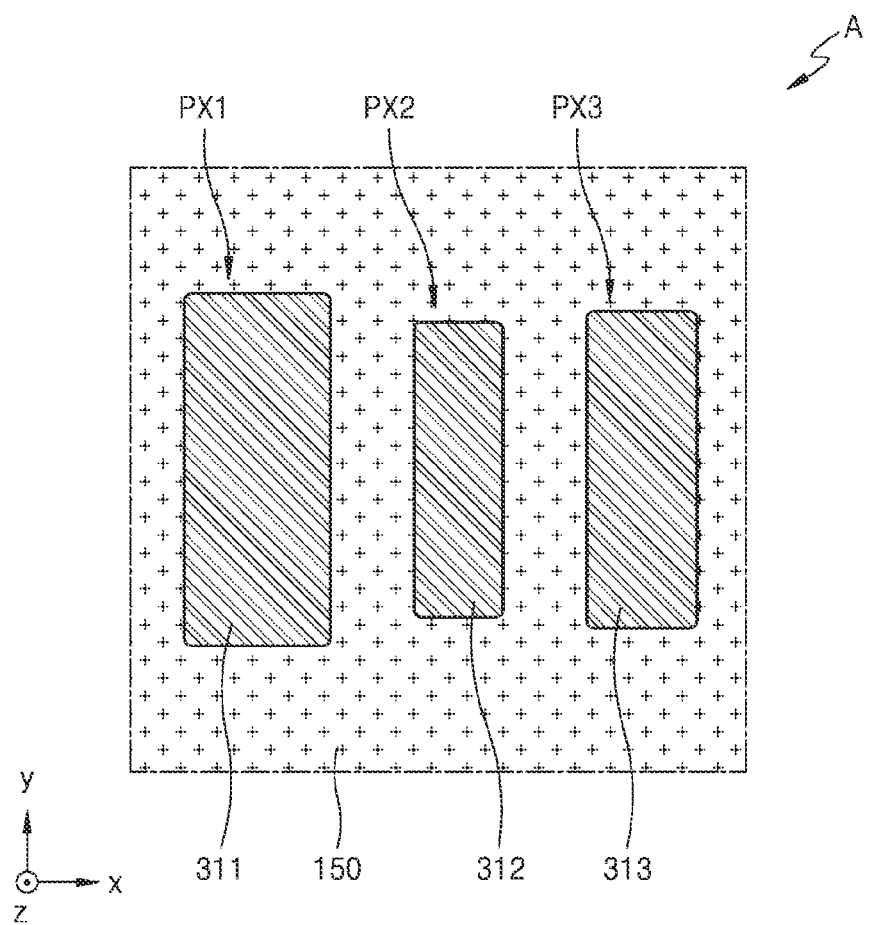
FIG. 3 is a plan view schematically illustrating a portion of a display apparatus according to an alternative embodiment.

However, the disclosure is not limited to arranging the first pixel PX1, the second pixel PX2, and the third pixel PX3 in the PenTile™ structure. In an alternative embodiment, for example, the first pixel PX1, the second pixel PX2, and the third pixel PX3 may be arranged in a stripe structure as shown in FIG. 3, which is a plan view schematically illustrating a portion of a display apparatus according to an alternative embodiment. In such an embodiment, the first pixel PX1, the second pixel PX2, and the third pixel PX3 may be sequentially arranged in the x-axis direction. Also, the pixels may be arranged in a mosaic structure.

Figure 4:
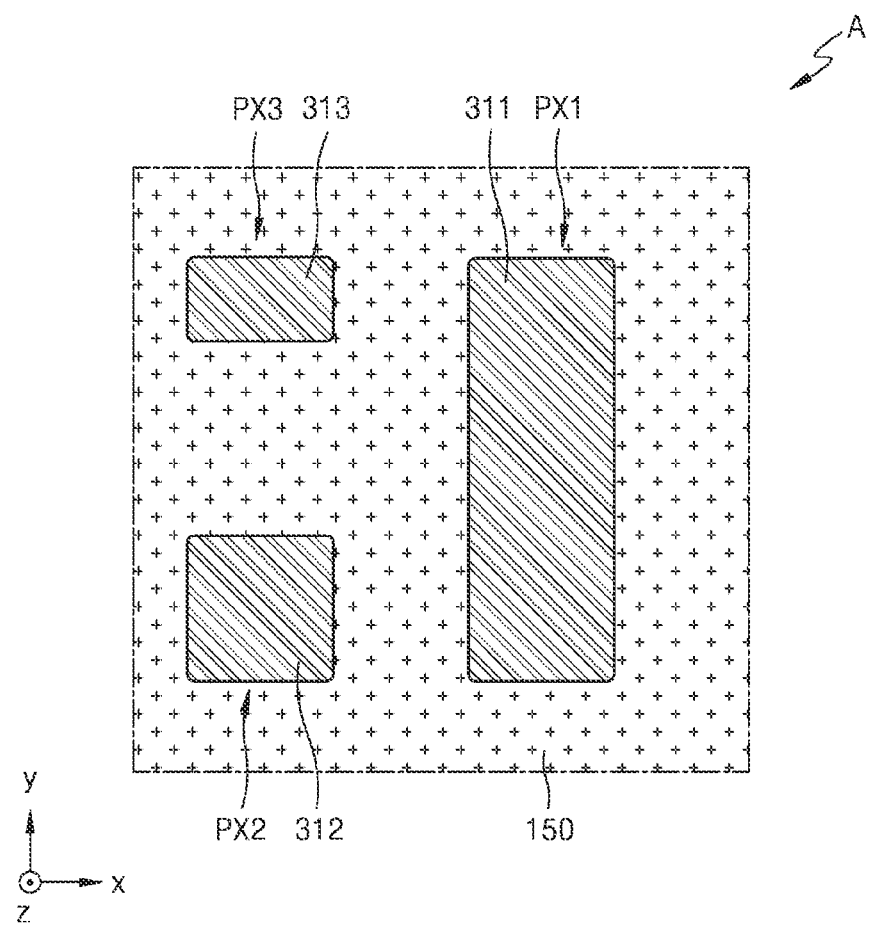
FIG. 4 is a plan view schematically illustrating a portion of a display apparatus according to another alternative embodiment.

In another alternative, the first pixel PX1, the second pixel PX2, and the third pixel PX3 may be arranged in an S-stripe structure as shown in FIG. 4, which is a plan view schematically illustrating a portion of a display apparatus according to another alternative embodiment. In such an embodiment, the second pixel PX2 and the third pixel PX3 may be alternately arranged with each other in the y-axis direction, and a pair of the second pixel PX2 and the third pixel PX3 and the first pixel PX1 may be alternately arranged with each other in the x-axis direction.

However, the disclosure is not limited thereto. In an alternative embodiment, for example, the first pixel PX1, the second pixel PX2, and the third pixel PX3 may be arranged in a stripe structure as shown in FIG. 5, which is a plan view schematically illustrating a portion of a display apparatus according to another alternative embodiment. The first pixel PX1 may be a pixel that emits a blue light, the second pixel PX2 may be a pixel that emits a red light, and the third pixel PX3 may be a pixel that emits a green light.

Sizes, that is, areas of the first pixel PX1, the second pixel PX2, and the third pixel PX3 may be different from each other. In an embodiment, for example, an area of the second pixel PX2 may be greater than an area of the first pixel PX1 and an area of the third pixel PX3. However, the disclosure is not limited thereto. In an embodiment, for example, the areas of the first pixel PX1, the second pixel PX2, and the third pixel PX3 may be substantially equal to each other. When viewed from the direction (the z-axis direction) perpendicular to the first substrate 100, the shapes and areas of the first pixel PX1, the second pixel PX2, and the third pixel PX3 may be respectively defined by the first color filter layer 810, the second color filter layer 820, and/or the third color filter layer 830, which are described in detail below with reference to FIG. 7.

The first pixel PX1 may include the first pixel electrode 311, the second pixel PX2 may include the second pixel electrode 312, and the third pixel PX3 may include the third pixel electrode 313. The pixel-defining layer 150 may cover an edge of each of the first pixel electrode 311, the second pixel electrode 312, and the third pixel electrode 313.

In an imaginary quadrangle VQ having a center of the second pixel PX2 as a center thereof, the first pixel PX1 may be arranged at the first vertex Q1, and may also be arranged at the second vertex Q2 neighboring the first vertex Q1. In addition, the third pixel PX3 may be arranged at the third vertex Q3 of the imaginary quadrangle VQ, which is positioned symmetrical to the first vertex Q1 with respect to the center of the imaginary quadrangle VQ, and the third pixel PX3 may also be arranged at the fourth vertex Q4 of the imaginary quadrangle VQ, which is positioned symmetrical to the second vertex Q2 with respect to the center of the imaginary quadrangle VQ. The imaginary quadrangle VQ may have a rectangular shape. The first pixel PX1 and the third pixel PX3 may be alternately arranged with each other in the x-axis direction. In a row in which the second pixel PX2 is located, only second pixels PX2 may be arranged in the x-axis direction. Pixels that emit light of a same color as each other may be arranged in the y-axis direction crossing the x-axis direction. Accordingly, a row of third pixels PX3 that emits a green light, a row of second pixels PX2 that emits a red light, and a row of first pixels PX1 that emits a blue light may be alternately arranged with each other in the x-axis direction.

In an embodiment, as shown in FIG. 5, each of portions exposed by the pixel-defining layer 150 in the first pixel electrode 311 of the first pixel PX1, the second pixel electrode 312 of the second pixel PX2, and the third pixel electrode 313 of the third pixel PX3 has a rectangular shape, more specifically, a rectangular shape with round edges, when viewed from the direction (the z-axis direction) perpendicular to the first substrate 100. However, the disclosure is not limited thereto. In another alternative embodiment, for example, as shown in FIG. 6, which is a plan view schematically illustrating a portion of a display apparatus according to another alternative embodiment, each of the portions exposed by the pixel-defining layer 150 in the first pixel electrode 311 of the first pixel PX1, the second pixel electrode 312 of the second pixel PX2, and the third pixel electrode 313 of the third pixel PX3 may have a rectangular chamfered shape, that is, an octagonal shape. In such an embodiment, a degree of chamfering of the edges may be different from each other. In such an embodiment, sides of the octagon may not be equal to each other in length.

In such an embodiment, as described above, when viewed from the direction (the z-axis direction) perpendicular to the first substrate 100, the shapes of the first pixel PX1, the second pixel PX2, and the third pixel PX3 may be respectively defined by a first color filter layer 810, a second color filter layer 820, and/or a third color filter layer 830, which are described below with reference to FIG. 7. Accordingly, each of the first pixel PX1, the second pixel PX2, and the third pixel PX3 defined by the first color filter layer 810, the second color filter layer 820, and/or the third color filter layer 830 may have a rectangular chamfered shape. In such an embodiment, the portions exposed by the pixel-defining layer 150 of the first pixel electrode 311 of the first pixel PX1, the second pixel electrode 312 of the second pixel PX2, and the third pixel electrode 313 of the third pixel PX3 may respectively differ in shape from the first pixel PX1, the second pixel PX2, and the third pixel PX3 that are respectively defined by the first color filter layer 810, the second color filter layer 820, and/or the third color filter layer 830.

Figure 7:
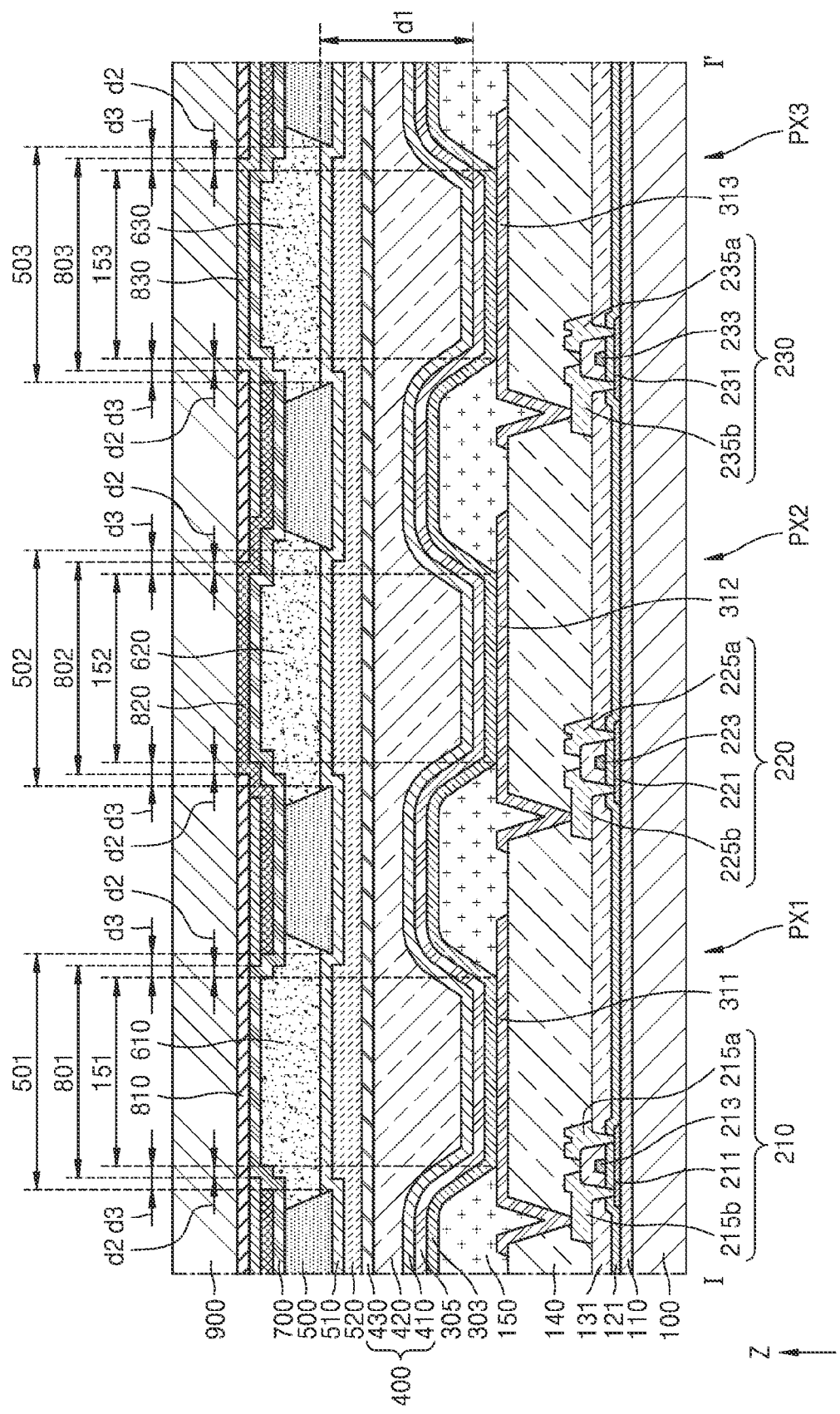
FIG. 7 is a cross-sectional view of the display apparatus of FIG. 2, taken along line I-I' of FIG. 2.
Figure 8:
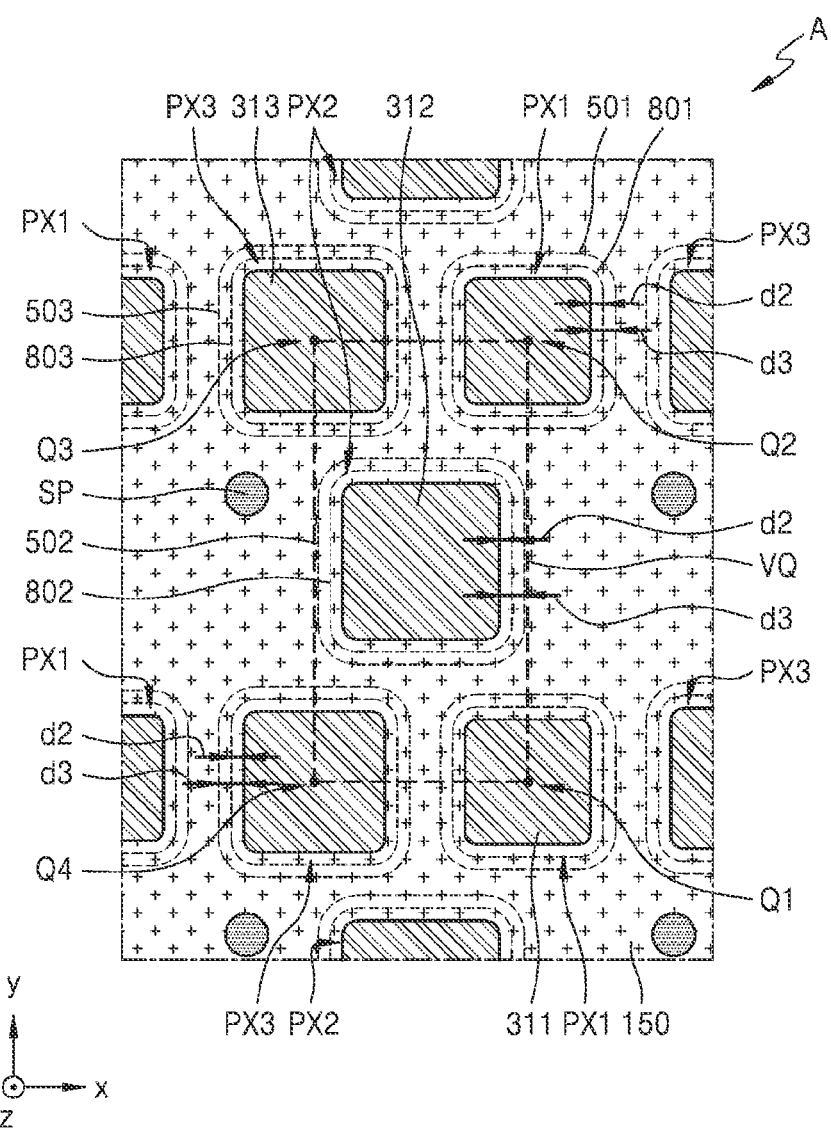
FIG. 8 is a plan view showing a relationship between elements of the display apparatus of FIG. 7.

FIG. 7 is a cross-sectional view schematically illustrating the display apparatus of FIG. 5, taken along line I-I' of FIG. 5, and FIG. 8 is a plan view showing a relationship between elements of the display apparatus of FIG. 7.

An embodiment of the display apparatus includes the first substrate 100, the first pixel electrode 311, the second pixel electrode 312, the third pixel electrode 313, the pixel-defining layer 150, an encapsulation layer 400, the second substrate 900, a bank 500, the light-transmitting layer 610, the first quantum dot layer 620, and the second quantum dot layer 630.

The first substrate 100 may include glass, metal, or a polymer resin. In an embodiment, for example, the first substrate 100 may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. In an embodiment, for example, the first substrate 100 may have a multi-layer structure including two layers and a barrier layer therebetween, in which the two layers include the polymer resin, and the barrier layer includes an inorganic material (a silicon oxide, a silicon nitride, a silicon oxynitride, etc.).

The first pixel electrode 311, the second pixel electrode 312, and the third pixel electrode 313 may be disposed over the first substrate 100. In an embodiment, in addition to the first pixel electrode 311, the second pixel electrode 312, and the third pixel electrode 313, a first thin-film transistor 210, a second thin-film transistor 220, and a third thin-film transistor 230 electrically connected to the first pixel electrode 311, the second pixel electrode 312, and the third pixel electrode 313, respectively, may be disposed over the first substrate 100. In such an embodiment, as shown in FIG. 7, the first pixel electrode 311 may be electrically connected to the first thin-film transistor 210, the second pixel electrode 312 may be electrically connected to the second thin-film transistor 220, and the third pixel electrode 313 may be electrically connected to the third thin-film transistor 230. The first pixel electrode 311, the second pixel electrode 312, and the third pixel electrode 313 may be disposed over a planarization layer 140 to be described below, which is disposed over the first substrate 100.

The first thin-film transistor 210 may include a first semiconductor layer 211, a first gate electrode 213, a first source electrode 215a, and a first drain electrode 215b, the first semiconductor layer 211 including an amorphous silicon, a polycrystalline silicon, an organic semiconductor material, or an oxide semiconductor material. The first gate electrode 213 may include various conductive materials or have various layered structures, for example, including a molybdenum (Mo) layer and an aluminum (Al) layer. In an embodiment, the first gate electrode 213 may have a layered structure of a Mo layer, an Al layer, and another Mo layer. In some embodiments, the first gate electrode 213 may include a titanium nitride (TiN$_x$) layer, an Al layer, and/or a titanium (Ti) layer. Each of the first source electrode 215a and the first drain electrode 215b may also include various conductive materials or have various layered structures, for example, including a Ti layer, an Al layer, and/or a Cu layer. In an embodiment, each of the first source electrode 215a and the first drain electrode 215b may have a layered structure of a Ti layer, an Al layer, and another Ti layer.

In an embodiment, as shown in FIG. 7, the first thin-film transistor 210 has both the first source electrode 215a and the first drain electrode 215b. However, the disclosure is not limited thereto. In an alternative embodiment, for example, a source area of the first semiconductor layer 211 of the first thin-film transistor 210 may be integrally provided or formed as a single unitary and indivisible body with a drain area of a semiconductor layer of another thin-film transistor. In such an embodiment, the first thin-film transistor 210 may not include the first source electrode 215a separately provided. In such an embodiment, the first source electrode 215a and/or the first drain electrode 215b may be defined by a part of a wiring.

To ensure insulation between the first semiconductor layer 211 and the first gate electrode 213, a gate insulation layer 121 may be disposed between the first semiconductor layer 211 and the first gate electrode 213, the gate insulation layer 121 including an inorganic material such as a silicon oxide, a silicon nitride, and/or a silicon oxynitride, for example. In an embodiment, an interlayer insulation layer 131 may be disposed over the first gate electrode 213, and the first source electrode 215a and the first drain electrode 215b may be disposed over the interlayer insulation layer 131, the interlayer insulation layer 131 including an inorganic material such as a silicon oxide, a silicon nitride, and/or a silicon oxynitride, for example. The insulation layer including the inorganic material may be formed by chemical vapor deposition ("CVD") or atomic layer deposition ("ALD") which may be applied to embodiments to be described below and modifications thereof.

A buffer layer 110 may be disposed between the first thin-film transistor 210 having the structure described above and the first substrate 100, the buffer layer 110 including an inorganic material such as a silicon oxide, a silicon nitride, and/or a silicon oxynitride. The buffer layer 110 may increase the smoothness of an upper surface of the first substrate 100 or prevent or minimize the permeation of impurities from the first substrate 100 or the like through the first semiconductor layer 211 of the first thin-film transistor 210.

The second thin-film transistor 220 located in the second pixel PX2 may include a second semiconductor layer 221, a second gate electrode 223, a second source electrode 225a, and a second drain electrode 225b. The third thin-film transistor 230 located in the third pixel PX3 may include a third semiconductor layer 231, a third gate electrode 233, a third source electrode 235a, and a third drain electrode 235b. In such an embodiment, a structure of the second thin-film transistor 220 and a structure of the third thin-film transistor 230 are the same as or similar to that of the first thin-film transistor 210 located in the first pixel PX1, and any repetitive detailed descriptions thereof will be omitted.

The planarization layer 140 may be disposed over the first thin-film transistor 210. In an embodiment, for example, when a light-emitting element including the first pixel electrode 311 is disposed over the first thin-film transistor 210 as shown in FIG. 7, the planarization layer 140 covering the first thin-film transistor 210 may have an approximately flat upper surface so that the first pixel electrode 311 or the like is disposed thereon. In an embodiment, for example, the planarization layer 140 may include an organic material, such as acryl, benzocyclobutene ("BCB"), or hexamethyldisiloxane ("HMDSO"). In an embodiment, as shown in FIG. 7, the planarization layer 140 is a single layer. Alternatively, the planarization layer 140 may include layers, and various modifications may be made.

An organic light-emitting element may be located in the first pixel PX1, the organic light-emitting element including the first pixel electrode 311, an opposite electrode 305, and an intermediate layer 303 therebetween and including an emission layer. In an embodiment, as shown in FIG. 7, the first pixel electrode 311 may contact either the first source electrode 215a or the first drain electrode 215b via a contact hole formed in the planarization layer 140 and be electrically connected to the first thin-film transistor 210. The first pixel electrode 311 may include a light-transmitting conductive layer and a reflective layer, in which the light-transmitting conductive layer includes a light-transmitting conductive oxide, such as indium tin oxide ("ITO"), indium oxide ($In_2O_3$), and indium zinc oxide ("IZO"), and the reflective layer includes metal such as Al or silver (Ag). In an embodiment, for example, the first pixel electrode 311 may have a three-layer structure of an ITO layer, an Ag layer, and another ITO layer.

An organic light-emitting element may also be located in the second pixel PX2, the organic light-emitting element including a second pixel electrode 312, the opposite electrode 305, and the intermediate layer 303 therebetween and including an emission layer. In an embodiment, the organic light-emitting element may also be located in the third pixel PX3, the organic light-emitting element including a third pixel electrode 313, the opposite electrode 305, and the intermediate layer 303 therebetween and including an emission layer. The second pixel electrode 312 may contact either the second source electrode 225a or the second drain electrode 225b via a contact hole defined or formed in the planarization layer 140 and be electrically connected to the second thin-film transistor 220. The third pixel electrode 313 may contact either the third source electrode 235a or the third drain electrode 235b via a contact hole defined or formed in the planarization layer 140 and be electrically connected to the third thin-film transistor 230. Features of the second pixel electrode 312 and the third pixel electrode 313 may be substantially the same as the features of the first pixel electrode 311 described above.

In an embodiment, as described above, the intermediate layer 303 including the emission layer may be located not only over the first pixel electrode 311 of the first pixel PX1, but also over the second pixel electrode 312 of the second pixel PX2 and the third pixel electrode 313 of the third pixel PX3. The intermediate layer 303 may be integrally formed as a single unitary and indivisible body across the first pixel electrode 311, the second pixel electrode 312, and the third pixel electrode 313. In an alternative embodiment, the intermediate layer 303 may be patterned and disposed on the first pixel electrode 311, the second pixel electrode 312, and the third pixel electrode 313. In an embodiment, the intermediate layer 303 may also include a hole injection layer, a hole transport layer, and/or an electron transport layer in addition to the emission layer, and the layers included in the intermediate layer 303 may be integrally formed as a single body across the first pixel electrode 311, the second pixel electrode 312, and the third pixel electrode 313. In an alternative embodiment, some of the layers included in the intermediate layer 303 may be patterned and positioned over the first pixel electrode 311, the second pixel electrode 312, and the third pixel electrode 313. The emission layer included in the intermediate layer 303 may emit light having a wavelength in a first wavelength band. In an embodiment, for example, the first wavelength band may be about 450 nanometers (nm) to about 495 nm.

In an embodiment, the intermediate layer 303 may include a plurality of emission layers instead of a single emission layer. In an embodiment, for example, the intermediate layer 303 may have a structure in which a first emission layer and a second emission layer are stacked and a charge generation layer is disposed therebetween. In such an embodiment, a hole transport layer or an electron transport layer may be disposed between the first emission layer and the charge generation layer and between the second emission layer and the charge generation layer.

The opposite electrode 305 over the intermediate layer 303 may also be integrally formed as a single unitary and indivisible body across the first pixel electrode 311 through the third pixel electrode 313. The opposite electrode 305 may include a light-transmitting conductive layer including ITO, $In_2O_3$, or IZO, and may include a semi-transmissive layer including metal such as Al, lithium (Li), magnesium (Mg), ytterbium (Yb), or Ag. In an embodiment, for example, the opposite electrode 305 may be a semi-transmissive layer including magnesium-silver (MgAg), silver-ytterbium (AgYb), Yb/MgAg, or Li/MgAg.

The pixel-defining layer 150 may be disposed over the planarization layer 140. The pixel-defining layer 150 has or defines the pixel openings respectively corresponding to the pixels. In such an embodiment, the pixel-defining layer 150 may cover an edge of each of the first pixel electrode 311, the second pixel electrode 312, and the third pixel electrode 313, and a first pixel opening 151 exposing a central portion of the first pixel electrode 311, a second pixel opening 152 exposing a central portion of the second pixel electrode 312, and a third pixel opening 153 exposing a central portion of the third pixel electrode 313 may be defined through the pixel-defining layer 150. In an embodiment, as shown in FIG. 7, the pixel-defining layer 150 may increase a distance between each of the edges of the first pixel electrode 311, the second pixel electrode 312, and the third pixel electrode 313 and the opposite electrode 305, thereby preventing an arc or the like from occurring at the edges of the first pixel electrode 311, the second pixel electrode 312, and the third pixel electrode 313. In an embodiment, for example, the pixel-defining layer 150 may include an organic material, such as polyimide or HMDSO.

An organic light-emitting element (such as an organic light emitting diode ("OLED")) including the first pixel electrode 311, the second pixel electrode 312, the third pixel electrode 313, the intermediate layer 303 including an emission layer, and the opposite electrode 305 may be easily degraded by moisture, oxygen, or the like. Thus, the display apparatus may include the encapsulation layer 400 covering the organic light-emitting elements to protect the organic light-emitting elements from external moisture or oxygen.

The encapsulation layer 400 may include at least one inorganic encapsulation layer and at least one organic encapsulation layer. In an embodiment, for example, the encapsulation layer 400 may include a first inorganic encapsulation layer 410, a second inorganic encapsulation layer 430, and an organic encapsulation layer 420 therebetween.

Each of the first inorganic encapsulation layer 410 and the second inorganic encapsulation layer 430 may include at least one inorganic insulating material, such as silicon oxide ($SiO_2$), silicon nitride ($SiN_x$), silicon oxynitride ($SiO_xN_y$), $Al_2O_3$, titanium oxide ($TiO_2$), tantalum oxide ($Ta_2O_5$), hafnium oxide ($HfO_2$), or zinc oxide (ZnO or $ZnO_2$), and may be formed by CVD or the like. The organic encapsulation layer 420 may include a polymer-based material. The polymer-based material may include at least one selected from a silicone-based resin, an acryl-based resin (e.g., poly(methyl methacrylate), polyacrylic acid, or the like), an epoxy-based resin, polyimide, and polyethylene.

The first inorganic encapsulation layer 410 formed by CVD has an approximately uniform thickness, and thus, the upper surface thereof may not be flat as shown in FIG. 7. In an embodiment, the organic encapsulation layer 420 has an approximately flat upper surface, and thus, the second inorganic encapsulation layer 430 over the organic encapsulation layer 420 may also have an approximately flat upper surface.

The second substrate 900 may be disposed over the first substrate 100 with the opposite electrode 305 therebetween. The second substrate 900 may include glass, metal, or a polymer resin. In an embodiment, for example, the second substrate 900 may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. In an embodiment, the second substrate 900 may have a multi-layer structure including two layers and a barrier layer therebetween, in which the two layers include a polymer resin, and the barrier layer includes an inorganic material (e.g., a silicon oxide, a silicon nitride, a silicon oxynitride, etc.).

The bank 500 may be disposed on a lower surface of the second substrate 900 in a direction (the −z direction) to the first substrate 100. The bank 500 may include or define a first bank opening 501, a second bank opening 502, and a third bank opening 503. The bank openings of the bank 500 may correspond to light-emitting elements. In an embodiment, for example, the first bank opening 501 of the bank 500 may correspond to the first pixel opening 151 of the pixel-defining layer 150 that exposes the first pixel electrode 311, the second bank opening 502 of the bank 500 may correspond to the second pixel opening 152 of the pixel-defining layer 150 that exposes the second pixel electrode 312, and the third bank opening 503 of the bank 500 may correspond to the third pixel opening 153 of the pixel-defining layer 150 that exposes the third pixel electrode 313.

In such an embodiment, when viewed from the direction (the z-axis direction) perpendicular to the first substrate 100, the first bank opening 501 of the bank 500 may overlap the first pixel opening 151 of the pixel-defining layer 150 that exposes the first pixel electrode 311, the second bank opening 502 of the bank 500 may overlap the second pixel opening 152 of the pixel-defining layer 150 that exposes the second pixel electrode 312, and the third bank opening 503 of the bank 500 overlaps the third pixel opening 153 of the pixel-defining layer 150 that exposes the third pixel electrode 313. Accordingly, when viewed from the direction (the z-axis direction) perpendicular to the first substrate 100, a shape of an edge of each of the first bank opening 501 through the third bank opening 503 of the bank 500 may be the same as or similar to that of an edge of the corresponding pixel opening of the pixel-defining layer 150. In an embodiment, as described above, the first bank opening 501 of the bank 500 may correspond to the first pixel electrode 311, the second bank opening 502 of the bank 500 may correspond to the second pixel electrode 312, and the third bank opening 503 of the bank 500 may correspond to the third pixel electrode 313.

In such an embodiment, when viewed from the direction (the z-axis direction) perpendicular to the first substrate 100, an area of the first bank opening 501 of the bank 500 may be greater than that of the first pixel opening 151 of the pixel-defining layer 150, an area of the second bank opening 502 of the bank 500 may be greater than that of the second pixel opening 152 of the pixel-defining layer 150, and an area of the third bank opening 503 of the bank 500 may be greater than that of the third pixel opening 153 of the pixel-defining layer 150. Accordingly, light generated in the first pixel opening 151 of the pixel-defining layer 150 by the organic light-emitting element may be sufficiently incident into the first bank opening 501 of the bank 500, light generated in the second pixel opening 152 of the pixel-defining layer 150 by the organic light-emitting element may be sufficiently incident into the second bank opening 502 of the bank 500, and light generated in the third pixel opening 153 of the pixel-defining layer 150 by the organic light-emitting element may be sufficiently incident into the third bank opening 503 of the bank 500.

The bank 500 may include at least one selected from various materials, for example, an organic material such as acryl, BCB, or HMDSO. In an embodiment, the bank 500 may further include a photoresist material, through which the bank 500 may be easily provided through processes such as exposure and development. In a manufacturing process, the first substrate 100 and the second substrate 900 may be bonded to each other by using an adhesive member after forming the bank 500 over the second substrate 900 and forming the light-transmitting layer 610, the first quantum dot layer 620, and the second quantum dot layer 630 to be described later, in the bank openings of the bank 500. In an embodiment where the bank 500 is provided over the second substrate 900 through the processes such as exposure and development, an area of a side of the bank 500 when viewed in the direction (the −z direction) to the first substrate 100 is greater than that of a side of the bank 500 when viewed in the direction (the +z direction) to the second substrate 900. Accordingly, as shown in FIG. 7, in a cross-sectional view the bank 500 may have a reverse-tapered shape with respect to the second substrate 900.

In the first pixel PX1, light having a wavelength in the first wavelength band generated by the intermediate layer 303 including the emission layer may pass through the encapsulation layer 400 without wavelength conversion and be emitted to the outside. Accordingly, the light-transmitting layer 610 including a light-transmitting resin may be located in the first bank opening 501 of the bank 500 overlapping the first pixel electrode 311. In an alternative embodiment, the light-transmitting layer 610 may not be located in the first bank opening 501 of the bank 500, unlike shown in FIG. 7. The light-transmitting layer 610 may include a light-transmitting resin and a scatterer.

The scatterer included in the light-transmitting layer 610 is not particularly limited as long as a material thereof is capable of partially scattering light incident thereon by forming an optical interface between the scatterer and the light-transmitting resin, and may be, for example, metal oxide particles or organic particles. In an embodiment, for example, metal oxides for a scatterer include $TiO_2$, zirconium oxide ($ZrO_2$), $Al_2O_3$, $In_2O_3$, ZnO, or tin oxide ($SnO_2$), and organic materials for a scatterer include an acryl-based resin or a urethane-based resin. The scatterer may scatter incident light in multiple directions regardless of an incident angle of the incident light without substantially converting a wavelength of the light. Accordingly, the scatterer may improve the side visibility of the display apparatus.

The light-transmitting resin included in the light-transmitting layer 610 may include a light-transmitting material with high dispersion characteristics with respect to the scatterer. In an embodiment, for example, a polymer resin, such as an acryl-based resin, an imide-based resin, an epoxy-based resin, BCB, or HMDSO, may be used as the light-transmitting resin included in the light-transmitting layer 610. In an embodiment where an inkjet printing method is used to form the light-transmitting layer 610, a material for forming the light-transmitting layer 610, which is a mixture of the light-transmitting resin and the scatterer, may be located in the first bank opening 501 of the bank 500 overlapping the first pixel electrode 311.

The first quantum dot layer 620 may be located in the second bank opening 502 of the bank 500. The first quantum dot layer 620 may overlap the second pixel electrode 312 when viewed from the direction (the z-axis direction) perpendicular to the first substrate 100. In an embodiment where the first quantum dot layer 620 includes quantum dots capable of converting a wavelength of incident light, light having a wavelength in a first wavelength band that passes through the first quantum dot layer 620 may be converted into light having a wavelength in a second wavelength band. In an embodiment, for example, the second wavelength band may be about 625 nm to about 780 nm. However, the disclosure is not limited thereto, and a wavelength band including a wavelength to be converted by the first quantum dot layer 620 and a wavelength band including a wavelength after conversion may be modified.

In the first quantum dot layer 620, quantum dots may be dispersed within a resin. Herein, a quantum dot refers to a crystal of a semiconductor compound, and may include any material capable of emitting light of various emission wavelengths according to a size of the crystal. In an embodiment, for example, a diameter of the quantum dot may be in a range about 1 nm to about 10 nm.

The quantum dots may be synthesized by a wet chemical process, an organometallic chemical deposition process, a molecular beam epitaxy process, or a similar process. The wet chemical process refers to a method of growing quantum dot particle crystals after mixing an organic solvent with a precursor material. In the wet chemical process, when the crystals grow, an organic solvent naturally acts as a dispersant coordinated on a surface of the quantum dot crystals and controls the growth of the crystals. Therefore, the wet chemical process is easier than a vapor deposition method, such as metal organic chemical vapor deposition ("MOCVD") or molecular beam epitaxy ("MBE"). Furthermore, the wet chemical process is a low-cost process and also, the growth of quantum dot crystals may be controlled.

The quantum dots may include Group II-VI semiconductor compounds, Group III-V semiconductor compounds, Group III-VI semiconductor compounds, Group I-III-VI semiconductor compounds, Group IV-VI semiconductor compounds, Group IV element or compounds, or any combinations thereof.

in an embodiment, for example, the Group II-VI semiconductor compounds may include a binary compound such as CdS, CdSe, CdTe, ZnS, ZnSe, ZnTe, ZnO, HgS, HgSe, HgTe, MgSe, or MgS, a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS, a quaternary compound such as CdZnSeS, CdZnSeTe, CdZnSTe, CdHgSeS, CdHgSeTe, CdHgSTe, HgZnSeS, HgZnSeTe, or HgZnSTe, or any combinations thereof.

in an embodiment, for example, the Group III-V semiconductor compounds may include a binary compound such as GaN, GaP, GaAs, GaSb, AlN, AlP, AlAs, AlSb, InN, InP, InAs, or InSb, a ternary compound such as GaNP, GaNSb, GaPAs, GaPSb, AlNP, AlNAs, AlNSb, AlPAs, AlPSb, InGaP, InNP, InAlP, InNAs, InNSb, InPAs, or InPSb, a quaternary compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or GaAlNP, or any combinations thereof. In an embodiment, the Group III-V semiconductor compounds may further include a Group II element. In an embodiment, for example, the Group III-V semiconductor compounds further including the Group II element may include InZnP, InGaZnP, or InAlZnP.

In an embodiment, for example, the Group III-VI semiconductor compounds may include a binary compound such as GaS, GaSe, $Ga_2Se_3$, GaTe, InS, $In_2S_3$, InSe, $In_2Se_3$, or InTe, a ternary compound such as AgInS, $AgInS_2$, CuInS, $CuInS_2$, $InGaS_3$, or $InGaSe_3$, or any combinations thereof.

In an embodiment, for example, the Group I-III-VI semiconductor compounds may include a ternary compound such as AgInS, $AgInS_2$, CuInS, $CuInS_2$, $CuGaO_2$, $AgGaO_2$, or $AgAlO_2$, or any combinations thereof.

In an embodiment, for example, the Group IV-VI semiconductor compounds may include a binary compound such as SnS, SnSe, SnTe, PbS, PbSe, or PbTe, a ternary compound such as SnSeS, SnSeTe, SnSTe, PbSeS, PbSeTe, PbSTe, SnPbS, SnPbSe, or SnPbTe, a quaternary compound such as SnPbSSe, SnPbSeTe, or SnPbSTe, or any combinations thereof.

The Group IV elements or compounds may include a single element such as silicon (Si) or germanium (Ge), a binary compound such as silicon carbide (SiC) or silicon-germanium (SiGe), or any combinations thereof.

Each of elements included in a multi-element compound such as a binary compound, a ternary compound, and a quaternary compound may be present in particles in uniform or non-uniform concentrations.

In an embodiment, the quantum dots may have a single structure or a core-shell double structure in which the concentration of each element included in the quantum dots is uniform. In an embodiment, for example, a material included in the core may be different from a material included in the shell. The shell of the quantum dots may serve as a protective layer for preventing chemical modification and maintaining the semiconductor properties and/or as a charging layer for imparting electrophoretic properties to the quantum dots. The shell may include a layer or layers. An interface between the core and the shell may have a concentration gradient in which a concentration of an element decreases toward a center of the shell.

In an embodiment, for example, the shell of the quantum dots include a metal or non-metal oxide, a semiconductor compound, or a combination thereof. In an embodiment, for example, the metal or non-metal oxide may include a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, or $NiO$, a ternary compound such as $MgAl_2O_4$, $CoFe_2O_4$, $NiFe_2O_4$, or $CoMn_2O_4$, or any combinations thereof. In an embodiment, for example, the semiconductor compound may include the Group II-VI semiconductor compounds, the Group III-V semiconductor compounds, the Group III-VI semiconductor compounds, the Group I-Ill-VI semiconductor compounds, the Group IV-VI semiconductor compounds, or any combinations thereof as described above. In an embodiment, for example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combinations thereof.

The quantum dots may have a full width of half maximum ("FWHM") of an emission wavelength spectrum of about 45 nm or less, for example, about 40 nm or less, for example, about 30 nm or less, and color purity or color reproducibility may be improved in this range. In such an embodiment, light emitted through such quantum dots is emitted in all directions, and thus, the wide viewing angle may be improved.

In an embodiment, the shape of the quantum dots may be, for example, spherical, pyramidal, multi-arm or cubic, nanoparticles, nanotubes, nanowires, nanofibers, or nanoplatelet particles.

Because an energy band gap may be controlled by adjusting a size of the quantum dots, light of various wavelength bands may be obtained from a quantum dot emission layer. Therefore, a light-emitting element emitting light of multiple wavelengths may be implemented by using quantum dots of different sizes. In an embodiment, for example, the size of the quantum dots may be selected so that red, green, and/or blue light is emitted. In an embodiment, the size of the quantum dots may be configured such that light of various colors are combined with each other to emit white light.

The first quantum dot layer 620 may include a scatterer. Incident light may be scattered by the scatterer included in the first quantum dot layer 620 so that the incident light is efficiently converted by the quantum dots. The scatterer is not particularly limited as long as a material thereof is capable of partially scattering light incident thereon by forming an optical interface between the scatterer and a light-transmitting resin. A material for the scatterer included in the first quantum dot layer 620 may include at least one selected from the materials listed above for the scatterer included in the light transmitting layer 610. The scatterer may scatter incident light in multiple directions regardless of an incident angle thereof without substantially converting a wavelength of the light. Accordingly, the scatterer may improve the side visibility of the display apparatus. In such an embodiment, the scatterer included in the first quantum dot layer 620 may increase a probability that light incident onto the first quantum dot layer 620 is in contact with quantum dots, thereby improving light conversion efficiency.

The resin included in the first quantum dot layer 620 may include any light-transmitting material with high dispersion characteristics with respect to the scatterer. In an embodiment, for example, a polymer resin, such as an acryl-based resin, an imide-based resin, an epoxy-based resin, BCB, or HMDSO, may be used as a material for forming the first quantum dot layer 620. Through the inkjet printing method, the material for forming the first quantum dot layer 620 including the resin and the scatterer may be located in the second bank opening 502 of the bank 500 overlapping the second pixel electrode 312.

The second quantum dot layer 630 may be located in the third bank opening 503 of the bank 500. The second quantum dot layer 630 may overlap the third pixel electrode 313 when viewed from the direction (the z-axis direction) perpendicular to the first substrate 100.

In an embodiment where the second quantum dot layer 630 includes quantum dots capable of converting a wavelength of incident light, light having a wavelength in a first wavelength band passing through the second quantum dot layer 630 may be converted into light having a wavelength in a third wavelength band. In an embodiment, for example, the third wavelength band may be about 495 nm to about 570 nm. However, the disclosure is not limited thereto, and a wavelength band including a wavelength to be converted by the second quantum dot layer 630 and a wavelength band including a wavelength after conversion may be modified.

In the second quantum dot layer 630, quantum dots may be dispersed within a resin. Herein, a quantum dot refers to a crystal of a semiconductor compound, and may include any material capable of emitting light of various emission wavelengths according to a size of the crystal. In an embodiment, for example, a diameter of the quantum dot may be about 1 nm to about 10 nm. The features of the quantum dots included in the second quantum dot layer 630 may be substantially the same as those of the quantum dots included in the first quantum dot layer 620 described above, and thus, any repetitive detailed descriptions of the quantum dots included in the second quantum dot layer 630 will be omitted.

The second quantum dot layer 630 may include a scatterer. Incident light may be scattered by the scatterer included in the second quantum dot layer 630 so that the incident light is efficiently converted in the second quantum dot layer 630 by the quantum dots. The scatterer is not particularly limited as long as the material thereof is capable of partially scattering light incident thereon by forming an optical interface between the scatterer and the light-transmitting resin, and may be, for example, metal oxide particles or organic particles. A metal oxide for a scatterer or an organic material for a scatterer are as described above. The scatterer may scatter the incident light in multiple directions regardless of an incident angle of the incident light without substantially converting a wavelength of the light. Accordingly, the scatterer may improve the side visibility of the display apparatus. In such an embodiment, the scatterer included in the second quantum dot layer 630 may improve light conversion efficiency by increasing a probability that the light incident on the second quantum dot layer 630 is in contact with the quantum dots.

The resin included in the second quantum dot layer 630 may include any light-transmitting material with excellent dispersion characteristics with respect to the scatterer. In an embodiment, for example, a polymer resin, such as an acryl-based resin, an imide-based resin, an epoxy-based resin, BCB, or HMDSO, may be used as a material for forming the second quantum dot layer 630. Through the inkjet printing method, the material for forming the second quantum dot layer 630 including the resin and the scatterer may be located in the third bank opening 503 of the bank 500 overlapping the third pixel electrode 313.

A surface of the bank 500 in the direction (the −z direction) to the first substrate 100, a surface of the light-transmitting layer 610 in the direction (the −z direction) to the first substrate 100, a surface of the first quantum dot layer 620 in the direction (the −z direction) to the first substrate 100, and a surface of the second quantum dot layer 630 in the direction (the −z direction) to the first substrate 100 may be covered with a protective layer 510. The protective layer 510 may protect the light-transmitting layer 610, the first quantum dot layer 620, and the second quantum dot layer 630. The protective layer 510 may include an inorganic material, such as silicon nitride, silicon oxide, or silicon oxynitride.

Color filters may be located between the light-transmitting layer 610, the first quantum dot layer 620, and the second quantum dot layer 630 and the second substrate 900. The first color filter layer 810 may be disposed over the light-transmitting layer 610, the second color filter layer 820 may be disposed over the first quantum dot layer 620, and the third color filter layer 830 may be disposed over the second quantum dot layer 630. The first color filter layer 810 may be a layer that allows only light having a wavelength of about 450 nm to about 495 nm to pass therethrough. The second color filter layer 820 may be a layer that allows only light having a wavelength of about 625 nm to about 780 nm to pass therethrough. The third color filter layer 830 may be a layer that allows only light having a wavelength of about 495 nm to about 570 nm to pass therethrough.

The first color filter layer 810 through the third color filter layer 830 may increase a color purity of light emitted to the outside, thereby improving the quality of a displayed image. In addition, the first color filter layer 810 through the third color filter layer 830 may reduce a ratio in which external light incident onto the display apparatus from the outside is emitted to the outside after being reflected by the first pixel electrode 311 through the third pixel electrode 313, thereby reducing external light reflection. In an embodiment, a black matrix may be disposed between the first color filter layer 810 through the third color filter layer 830.

In an embodiment, the first color filter layer 810 may have or define a second filter opening 802 corresponding to the first quantum dot layer 620, as shown in FIG. 7. The second filter opening 802 of the first color filter layer 810 may define an area of the second pixel PX2. In such an embodiment, when viewed from a direction perpendicular to the first substrate 100, a shape and size of the second pixel PX2 may be defined by the second filter opening 802 of the first color filter layer 810. The second color filter layer 820 may fill at least the second filter opening 802 of the first color filter layer 810.

In an embodiment, the first color filter layer 810 may have or define a third filter opening 803 corresponding to the second quantum dot layer 630. The third filter opening 803 of the first color filter layer 810 may define an area of the third pixel PX3. In such an embodiment, when viewed from the direction perpendicular to the first substrate 100, a shape and size of the third pixel PX3 may be defined by the third filter opening 803 of the first color filter layer 810. The third color filter layer 830 may fill at least the third filter opening 803 of the first color filter layer 810.

In an embodiment, the third color filter layer 830 may have or define a first filter opening 801 corresponding to the light-transmitting layer 610. The first filter opening 801 of the third color filter layer 830 may define an area of the first pixel PX1. In such an embodiment, when viewed from the direction perpendicular to the first substrate 100, a shape and size of the first pixel PX1 may be defined by the first filter opening 801 of the third color filter layer 830. A low-refractive index layer 700 which will be described below may fill at least the first filter opening 801 of the third color filter layer 830.

In an embodiment, the first color filter layer 810 defines the area of the second pixel PX2 and the area of the third pixel PX3 through the second filter opening 802 and the third filter opening 803 as described above, and the first color filter layer 810 may be referred to as a filter-defining layer in the second pixel PX2 and the third pixel PX3. In such an embodiment, the third color filter layer 830 defines the first pixel PX1 through the first filter opening 801, and the third color filter layer 830 may be referred to as a filter-defining layer in the first pixel PX1. Alternatively, the filter-defining layer may also be referred to as a pixel area-defining layer.

In an embodiment, when viewed from the direction (the z-axis direction) perpendicular to the first substrate 100, an area of the first filter opening 801 is greater than an area of the first pixel opening 151 of the pixel-defining layer 150, an area of the second filter opening 802 of the first color filter layer 810 is greater than an area of the second pixel opening 152 of the pixel-defining layer 150, and an area of the third filter opening 803 of the first color filter layer 810 is greater than an area of the third pixel opening 153 of the pixel-defining layer 150. Accordingly, light generated in the first pixel opening 151 of the pixel-defining layer 150 by the organic light-emitting element may be sufficiently (or effectively) incident into the first filter opening 801 of the third color filter layer 830, light generated in the second pixel opening 152 of the pixel-defining layer 150 by the organic light-emitting element may be sufficiently incident into the second filter opening 802 of the first color filter layer 810, and light generated in the third pixel opening 153 of the pixel-defining layer 150 by the organic light-emitting element may be sufficiently incident into the third filter opening 803 of the first color filter layer 810.

In an embodiment, a portion in which at least two color filter layers overlap each other may serve as a black matrix. In an embodiment, for example, where the first color filter layer 810 allows only light having a wavelength of about 450 nm to about 495 nm to passes therethrough, and the second color filter layer 820 allows only light having a wavelength of about 625 nm to about 780 nm to passes therethrough, there is no light that may pass through both the first color filter layer 810 and the second color filter layer 820 is not in the portion in which the first color filter layer 810 and the second color filter layer 820 overlap each other. In such an embodiment, the color filters function as a black matrix between the first pixel PX1, the second pixel PX2, and the third pixel PX3 may be performed by allowing a portion in which all of the first color filter layer 810, the second color filter layer 820, and the third color filter layer 830 overlap each other to be between the first pixel PX1, the second pixel PX2, and the third pixel PX3.

A low-refractive index layer 700 may be disposed between the first color filter layer 810, the second color filter layer 820, and the third color filter layer 830 and the bank 500, the light-transmitting layer 610, the first quantum dot layer 620, and the second quantum dot layer 630. In a manufacturing process, the low-refractive index layer 700 may cover the first color filter layer 810, the second color filter layer 820, and the third color filter layer 830, and the bank 500 or the like may be disposed over the upper surface thereof. The low-refractive index layer 700 may include, for example, an inorganic material such as silicon oxide, silicon nitride, and silicon oxynitride, and may be formed by CVD.

The first substrate 100 and the second substrate 900 may be adhered to each other outside a display area by using an adhesive member such as sealant. In such an embodiment, a filler 520 may be filled between a stacked body on the first substrate 100 and a stacked body on the second substrate 900. In an embodiment, for example, the filler 520 may be filled between the encapsulation layer 400 and the protective layer 510. The filler 520 may include a resin, such as acryl or epoxy.

In an embodiment of the display apparatus, where a distance between an upper surface of a portion of the opposite electrode 305 overlapping the first pixel opening 151 in the direction (the +z direction) to the second substrate 900 and a lower surface of the light-transmitting layer 610 in the direction to the first substrate 100 is a first distance d1, and a distance between an edge of the first filter opening 801 and an edge of the first pixel opening 151 when viewed from the direction (the z-axis direction) perpendicular to the first substrate 100 is a second distance d2, a value obtained by dividing the second distance d2 by the first distance d1 may be greater than or equal to about 0.625 and less than or equal to about 1. In such an embodiment, a ratio of the second distance d2 to the first distance d1 may be greater than or equal to about 0.625 and less than or equal to about 1.

Figure 9:
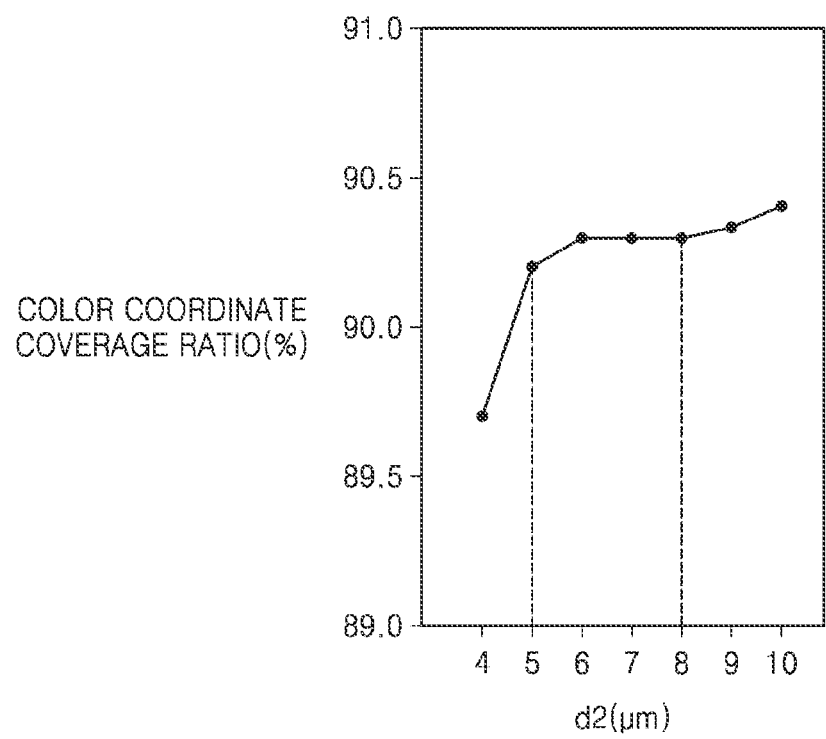
FIG. 9 is a graph showing a color coordinate coverage ratio according to the relationship between the elements of the display apparatus of FIG. 7.

FIG. 9 is a graph showing a color coordinate coverage ratio according to the relationship between the elements of the display apparatus of FIG. 7. Particularly, the graph shows a ratio of an area occupied by colors that may be expressed by the display apparatus on a BT.2020 diagram, for example. The BT.2020 diagram is a color coordinate diagram published by the International Telecommunication Union ("ITU"). As the ratio of the area occupied by the colors that may be expressed by the display apparatus on the BT.2020 diagram increases, the display apparatus may implement various colors included in the BT.2020 diagram. In FIG. 9, the horizontal axis is the second distance d2, and the unit is micrometer (μm). In FIG. 9, the vertical axis is a ratio of an area occupied by the colors that may be expressed by the display apparatus on the BT.2020 diagram. In this case, the first distance d1 is about 8 μm.

As can be seen in FIG. 9, when the second distance d2 is less than about 5 μm, a color coordinate coverage ratio of the display apparatus starts to rapidly decrease. This means that when the second distance d2 is less than about 5 μm, the diversity of colors that may be expressed by the display apparatus rapidly decreases. Thus, when the first distance d1 is about 8 μm, the second distance d2 is desired to be about 5 μm. When the first distance d1 is changed, a value of the second distance d2 at which the color coordinate coverage ratio of the display apparatus rapidly decreases also changes. Therefore, in an embodiment, the ratio of the second distance d2 to the first distance d1 is set to be greater than or equal to about 0.625, such that the efficiency of the display apparatus may be increased regardless of the first distance d1.

In addition, as can be seen in FIG. 9, when the second distance d2 is greater than or equal to about 5 μm and less than or equal to about 8 μm, the color coordinate coverage ratio of the display apparatus is constantly maintained. This means that, by allowing the second distance d2 to be greater than or equal to about 5 μm and less than or equal to about 8 μm, the display apparatus of uniform quality may be implemented. Thus, when the first distance d1 is about 8 μm, the second distance d2 is desired to be less than or equal to about 8 μm. When the first distance d1 is changed, the value of the second distance d2 at which a degree of improvement in the efficiency of the display apparatus rapidly decreases also changes. Therefore, in an embodiment, the ratio of the second distance d2 to the first distance d1 is set to be less than or equal to about 1, such that the efficiency of the display apparatus may be increased regardless of the first distance d1.

Figure 10:
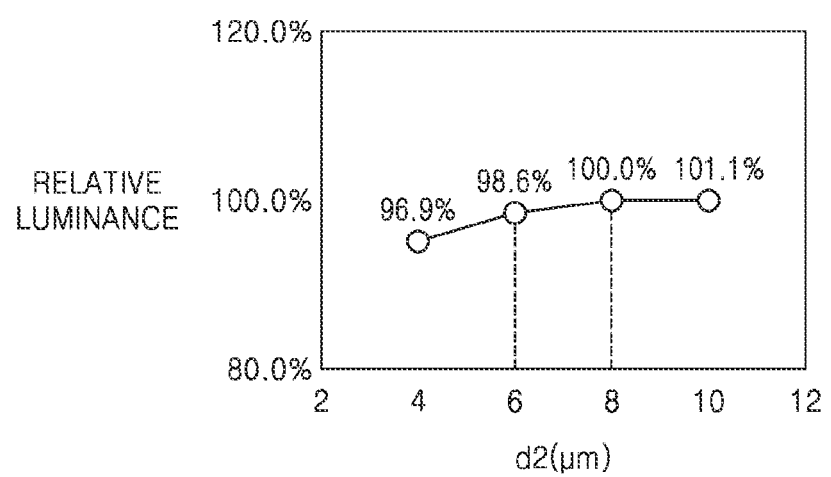
FIG. 10 is a graph showing relative luminance according to the relationship between the elements of the display apparatus of FIG. 7.

FIG. 10 is a graph showing relative luminance according to the relationship between the elements of the display apparatus of FIG. 7. In FIG. 10, the horizontal axis is the second distance d2, and the unit is μm. In FIG. 10, the vertical axis indicates a relative luminance at a front of the display apparatus, and 100.0% represents a relative luminance at the front of the display apparatus when the second distance d2 is about 8 μm. In this case, the first distance d1 is about 8 μm.

As can be seen in FIG. 10, when the second distance d2 is less than about 6 μm, a rate of decrease in luminance at the front of the display apparatus starts to increase. This means that the efficiency of the display apparatus may rapidly decrease when the second distance d2 is less than about 6 μm. Thus, when the first distance d1 is about 8 μm, for example, the second distance d2 needs to be about 6 μm. When the first distance d1 is changed, the value of the second distance d2 at which the efficiency of the display apparatus rapidly decreases also changes. Therefore, in an embodiment, the ratio of the second distance d2 to the first distance d1 is set to be greater than or equal to about 0.75, such that the efficiency of the display apparatus may be further increased regardless of the first distance d1.

In addition, as can be seen in FIG. 10, as the second distance d2 is increased, the luminance at the front of the display apparatus is increased. However, when the second distance d2 exceeds about 8 μm, the degree of improvement in the luminance rapidly decreases. This may be seen by the change in the slope of the graph in FIG. 10. Thus, when the first distance d1 is about 8 μm, the second distance d2 needs to be less than or equal to about 8 μm. When the first distance d1 is changed, the value of the second distance d2 at which a degree of improvement in the efficiency of the display apparatus rapidly decreases also changes. Therefore, in an embodiment, the ratio of the second distance d2 to the first distance d1 is set to be less than or equal to about 1, such that the efficiency of the display apparatus may be increased regardless of the first distance d1.

Figure 11:
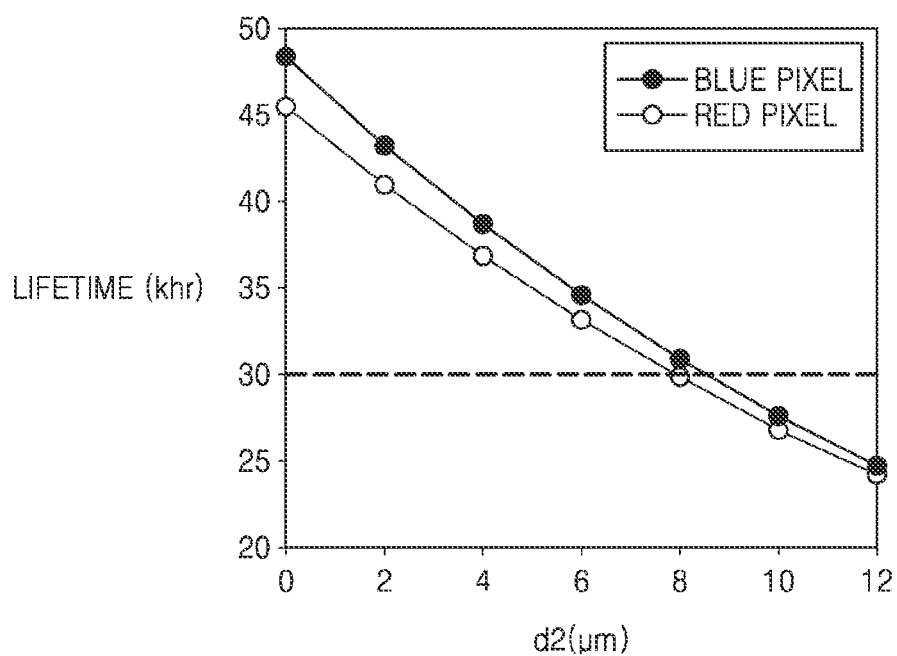
FIG. 11 is a graph showing a lifetime of a red pixel and a blue pixel according to the relationship between the elements of the display apparatus of FIG. 7.

FIG. 11 is a graph showing a lifetime of a red pixel and a blue pixel according to the relationship between the elements of the display apparatus of FIG. 7. In FIG. 11, the horizontal axis is the second distance d2, and the unit is μm. In FIG. 11, the vertical axis is a lifetime of a pixel, and the unit is one thousand hours. In this case, the first distance d1 is about 8 μm.

As can be seen in FIG. 11, as the second distance d2 increases, the lifetime of the red pixel and the blue pixel decreases. For example, when the second distance d2 exceeds about 8 µm, the lifetime of the red pixel and the blue pixel is less than 30,000 hours. A standard lifetime of pixels of the display apparatus is 30,000 hours. Thus, when the first distance d1 is about 8 µm, the second distance d2 is desired to be less than or equal to 8 µm. When the first distance d1 is changed, the value of the second distance d2 at which the lifetime of the pixels of the display apparatus is less than 30,000 hours also changes. Therefore, in an embodiment, the ratio of the second distance d2 to the first distance d1 is set to be less than or equal to 1, such that the efficiency of the display apparatus may be increased regardless of the first distance d1.

In an embodiment where the distance between the upper surface of the portion of the opposite electrode 305 overlapping the first pixel opening 151 in the direction (the +z direction) to the second substrate 900 and the lower surface of the light-transmitting layer 610 in the direction to the first substrate 100 is the first distance d1, and the distance between the edge of the first filter opening 801 and the edge of the first pixel opening 151 when viewed from the direction (the z-axis direction) perpendicular to the first substrate 100 is the second distance d2, the ratio of the second distance d2 to the first distance d1 may be greater than or equal to about 0.625 and less than or equal to about 1, and may be, for example, greater than or equal to about 0.75 and less than or equal to about 1. This may also be applicable to the second pixel PX2 and the third pixel PX3.

In such an embodiment, where a distance between an upper surface of a portion of the opposite electrode 305 overlapping the second pixel opening 152 in the direction (the +z direction) to the second substrate 900 and a lower surface of the first quantum dot layer 620 in the direction to the first substrate 100 is the first distance d1, and a distance between an edge of the second filter opening 802 and the edge of the second pixel opening 152 when viewed from the direction (the z-axis direction) perpendicular to the first substrate 100 is the second distance d2, the ratio of the second distance d2 to the first distance d1 may be greater than or equal to about 0.625 and less than or equal to about 1, and may be, for example, greater than or equal to about 0.75 and less than or equal to about 1. In an embodiment, where a distance between an upper surface of a portion of the opposite electrode 305 overlapping the third pixel opening 153 in the direction (the +z direction) to the second substrate 900 and a lower surface of the second quantum dot layer 630 in the direction to the first substrate 100 is the first distance d1, and a distance between an edge of the third filter opening 803 and an edge of the third pixel opening 153 when viewed from the direction (the z-axis direction) perpendicular to the first substrate 100 is the second distance d2, the ratio of the second distance d2 to the first distance d1 may be greater than or equal to about 0.625 and less than or equal to about 1, and may be, for example, greater than or equal to about 0.75 and less than or equal to about 1.

In an embodiment, when viewed from the direction (the z-axis direction) perpendicular to the first substrate 100, an area of the first bank opening 501 of the bank 500 is greater than an area of the first filter opening 801, an area of the second bank opening 502 of the bank 500 is greater than an area of the second filter opening 802, and an area of the third bank opening 503 of the bank 500 is greater than an area of the third filter opening 803. Accordingly, when viewed from the direction (the z-axis direction) perpendicular to the first substrate 100, light passing through the edge of the first quantum dot layer 620 may be blocked by the first color filter layer 810 instead of passing through the second filter opening 802. In such an embodiment, when viewed from the direction (the z-axis direction) perpendicular to the first substrate 100, light passing through the edge of the second quantum dot layer 630 may be blocked by the first color filter layer 810 instead of passing through the third filter opening 803. In such an embodiment, when viewed from the direction (the z-axis direction) perpendicular to the first substrate 100, light passing through the edge of the light-transmitting layer 610 may be blocked by the third color filter layer 830 instead of passing through the first filter opening 801.

In an embodiment, when viewed from the direction (the z-axis direction) perpendicular to the first substrate 100, a color coordinate of the light passing through the edge of the first quantum dot layer 620 may be different from that of light passing through a central portion of the first quantum dot layer 620. In such an embodiment, when viewed from the direction (the z-axis direction) perpendicular to the first substrate 100, a color coordinate of the light passing through the edge of the second quantum dot layer 630 may be different from that of light passing through a central portion of the second quantum dot layer 630. In such an embodiment, when viewed from the direction (the z-axis direction) perpendicular to the first substrate 100, a color coordinate of the light passing through the edge of the light-transmitting layer 610 may be different from that of light passing through a central portion of the light-transmitting layer 610. Accordingly, when viewed from the direction (the z-axis direction) perpendicular to the first substrate 100, an area of the first bank opening 501 of the bank 500 is greater than an area of the first filter opening 801, an area of the second bank opening 502 of the bank 500 is greater than an area of the second filter opening 802, and an area of the third bank opening 503 of the bank 500 is greater than an area of the third filter opening 803. Thus, in such an embodiment, light having inappropriate color coordinates may be effectively prevented from proceeding to the outside of the display apparatus.

In embodiments of the display apparatus described above, where a distance between an upper surface of a portion of the opposite electrode 305 overlapping the first pixel opening 151 in the direction (the +z direction) to the second substrate 900 and a lower surface of the light-transmitting layer 610 in the direction to the first substrate 100 is a first distance d1, and a distance between an edge of the first bank opening 501 and an edge of the first pixel opening 151 when viewed from the direction (the z-axis direction) perpendicular to the first substrate 100 is a third distance d3, a ratio of the third distance d3 to the first distance d1 may be greater than or equal to about 0.75 and less than or equal to about 1.25.

Figure 12:
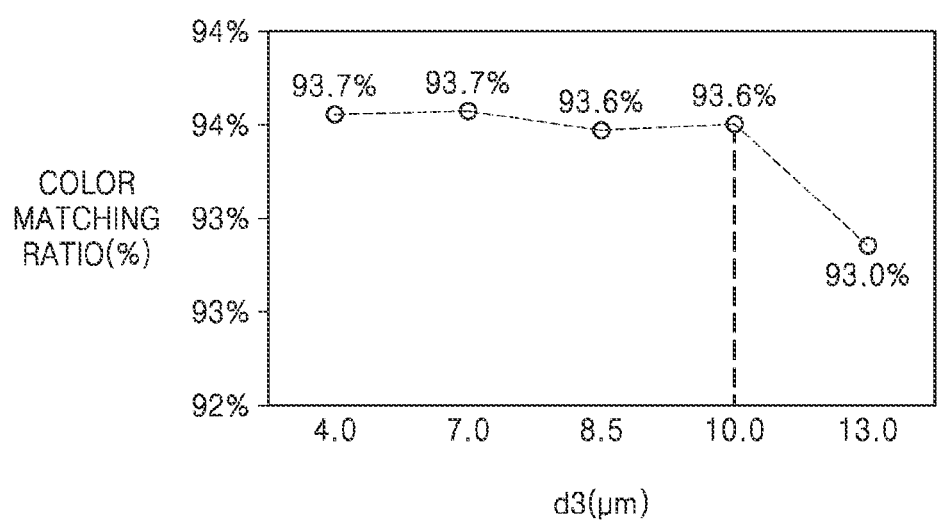
FIG. 12 is a graph showing a color matching ratio according to the relationship between the elements of the display apparatus of FIG. 7.

FIG. 12 is a graph showing a color matching ratio according to the relationship between the elements of the display apparatus of FIG. 7. In FIG. 12, the horizontal axis is the third distance d3, and the unit is µm. In FIG. 12, the vertical axis indicates a color matching ratio at the front of the display apparatus. The color matching ratio refers to a ratio that, after color coordinates of red light, green light, and blue light emitted from the display apparatus are measured, a measurement triangle created by the corresponding color coordinates in the BT.2020 diagram matches an ideal triangle created by color coordinates of ideal red light, ideal green light, and ideal blue light in the BT.2020 diagram.

In other words, the color matching ratio is a ratio of an area of a portion of the measurement triangle overlapping the ideal triangle to an area of the ideal triangle. As the color matching ratio is increases, it may be understood that the display apparatus may display high-quality images by realizing images of various colors. In this case, the first distance d1 is about 8 μm.

It may be seen in FIG. 12 that the color matching ratio of the display apparatus rapidly decreases when the third distance d3 exceeds about 10 μm. Thus, when the first distance d1 is about 8 μm, the third distance d3 needs to be less than or equal to about 10 μm. When the first distance d1 is changed, a value of the third distance d3 at which the color matching ratio of the display apparatus rapidly decreases also changes. Therefore, in an embodiment, the ratio of the third distance d3 to the first distance d1 is set to be less than or equal to about 1.25, such that the color matching ratio of the display apparatus may be increased regardless of the first distance d1. In such an embodiment, as described above, because the area of the first bank opening 501 may be greater than or equal to the area of the first filter opening 801, the third distance d3 is desired to be greater than or equal to about 6 μm. In such an embodiment, the ratio of the third distance d3 to the first distance d1 is desired to be greater than or equal to about 0.75, and may be identical to the ratio of the second distance d2 to the first distance d1.

As described above, in an embodiment where the distance between the upper surface of the portion of the opposite electrode 305 overlapping the first pixel opening 151 in the direction (the +z direction) to the second substrate 900 and the lower surface of the light-transmitting layer 610 in the direction to the first substrate 100 is the first distance d1, and the distance between the edge of the first bank opening 501 and the edge of the first pixel opening 151 when viewed from the direction (the z-axis direction) perpendicular to the first substrate 100 is the third distance d3, the ratio of the third distance d3 to the first distance d1 may be greater than or equal to about 0.75 and less than or equal to about 1.25. This may also be applicable to the second pixel PX2 and the third pixel PX3.

In such an embodiment, where a distance between an upper surface of a portion of the opposite electrode 305 overlapping the second pixel opening 152 in the direction (the +z direction) to the second substrate 900 and a lower surface of the first quantum dot layer 620 in the direction to the first substrate 100 is the first distance d1, and a distance between an edge of the second bank opening 502 and the edge of the second pixel opening 152 when viewed from the direction (the z-axis direction) perpendicular to the first substrate 100 is the third distance d3, the ratio of the third distance d3 to the first distance d1 may be greater than or equal to about 0.75 and less than or equal to about 1.25. In such an embodiment, where a distance between an upper surface of a portion of the opposite electrode 305 overlapping the third pixel opening 153 in the direction (the +z direction) to the second substrate 900 and a lower surface of the second quantum dot layer 630 in the direction to the first substrate 100 is the first distance d1, and a distance between an edge of the third bank opening 503 and the edge of the third pixel opening 153 when viewed from the direction (the z-axis direction) perpendicular to the first substrate 100 is the third distance d3, the ratio of the third distance d3 to the first distance d1 may be greater than or equal to about 0.75 and less than or equal to about 1.25.

In a case where the area of the first bank opening 501 is not equal to the area of the first filter opening 801 but greater than the area of the first filter opening 801, when the first distance d1 is about 8 μm, the third distance d3 may be greater than about 6 μm and less than or equal to 10 μm, and accordingly, the ratio of the third distance d3 to the first distance d1 may be greater than 0.75 and less than or equal to 1.25.

In an embodiment, as shown in FIG. 8, the second distance d2 may be constant along the edge of the first pixel opening 151, the edge of the second pixel opening 152, and the edge of the third pixel opening 153. In such an embodiment, the third distance d3 may be constant along the edge of the first pixel opening 151, the edge of the second pixel opening 152, and the edge of the third pixel opening 153.

According to embodiments of the disclosure, as described above, a display apparatus in which a high-quality image may be displayed may be implemented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
  a first substrate;
  a pixel electrode disposed over the first substrate;
  a pixel-defining layer which covers an edge of the pixel electrode, wherein a pixel opening is defined through the pixel-defining layer to expose a central portion of the pixel electrode;
  an emission layer disposed over the pixel electrode, wherein the emission layer emits light having a wavelength in a first wavelength band;
  an opposite electrode disposed over the emission layer;
  a second substrate disposed over the first substrate with the opposite electrode therebetween;
  a bank disposed on a lower surface of the second substrate, wherein a bank opening, which overlaps the pixel opening and has an area greater than an area of the pixel opening when viewed from a direction perpendicular to the first substrate, is defined through the bank;
  a quantum dot layer or a light-transmitting layer disposed in the bank opening; and
  a filter-defining layer disposed between the bank and the second substrate, wherein a filter opening, which overlaps the pixel opening and has an area greater than the area of the pixel opening when viewed from the direction perpendicular to the first substrate, is defined through the filter-defining layer,
  wherein
  a distance between an upper surface of a portion of the opposite electrode overlapping the pixel opening in the direction perpendicular to the first substrate and a lower surface of the quantum dot layer or the light-transmitting layer in the direction perpendicular to the first substrate is defined as a first distance,
  a distance between an edge of the filter opening and an edge of the pixel opening when viewed from the direction perpendicular to the first substrate is defined as a second distance, and
  a ratio of the second distance to the first distance is greater than or equal to 0.625 and less than or equal to 1.

2. The display apparatus of claim 1, wherein the second distance is constant along the edge of the pixel opening.

3. The display apparatus of claim 1, wherein the second distance is greater than or equal to about 5 μm and less than or equal to about 8 μm.

4. The display apparatus of claim 1, wherein the area of the bank opening when viewed from the direction perpendicular to the first substrate is greater than or equal to the area of the filter opening.

5. The display apparatus of claim 4, wherein
a distance between an edge of the bank opening and the edge of the pixel opening when viewed from the direction perpendicular to the first substrate is defined as a third distance, and
a ratio of the third distance to the first distance is greater than or equal to 0.75 and less than or equal to 1.25.

6. The display apparatus of claim 5, wherein the third distance is constant along the edge of the pixel opening.

7. The display apparatus of claim 5, wherein the third distance is greater than or equal to about 6 μm and less than or equal to about 10 μm.

8. The display apparatus of claim 1, wherein the area of the bank opening when viewed from the direction perpendicular to the first substrate is greater than the area of the filter opening.

9. The display apparatus of claim 8, wherein
a distance between an edge of the bank opening and the edge of the pixel opening when viewed from the direction perpendicular to the first substrate is defined as a third distance, and
a ratio of the third distance to the first distance is greater than 0.75 and less than or equal to 1.25.

10. The display apparatus of claim 9, wherein the third distance is constant along the edge of the pixel opening.

11. The display apparatus of claim 9, wherein the third distance is greater than about 6 μm and less than or equal to about 10 μm.

12. The display apparatus of claim 1, wherein the quantum dot layer converts the light having the wavelength in the first wavelength band into light having a wavelength in a second wavelength band.

13. The display apparatus of claim 12, further comprising:
a color filter layer which fills the filter opening and allows the light having the wavelength in the second wavelength band to pass therethrough.

14. The display apparatus of claim 1, wherein the ratio of the second distance to the first distance is greater than or equal to about 0.75 and less than or equal to about 1.

15. The display apparatus of claim 14, wherein the second distance is greater than or equal to about 6 μm and less than or equal to about 8 μm.

16. A display apparatus comprising:
a first substrate;
a pixel electrode disposed over the first substrate;
a pixel-defining layer which covers an edge of the pixel electrode, wherein a pixel opening is defined through the pixel-defining layer to expose a central portion of the pixel electrode;
an emission layer disposed over the pixel electrode, wherein the emission layer emits light having a wavelength in a first wavelength band;
an opposite electrode disposed over the emission layer;
a second substrate disposed over the first substrate with the opposite electrode therebetween;
a bank disposed on a lower surface of the second substrate in a direction to the first substrate, wherein a bank opening, which overlaps the pixel opening and has an area greater than an area of the pixel opening when viewed from a direction perpendicular to the first substrate, is defined through the bank; and
a filter-defining layer disposed between the bank and the second substrate, wherein a filter opening, which overlaps the pixel opening and has an area greater than the area of the pixel opening when viewed from the direction perpendicular to the first substrate, is defined through the filter-defining layer,
wherein a distance between an edge of the filter opening and an edge of the pixel opening when viewed from the direction perpendicular to the first substrate is greater than or equal to about 5 μm and less than or equal to about 8 μm.

17. The display apparatus of claim 16, wherein the distance between the edge of the filter opening and the edge of the pixel opening is constant along the edge of the pixel opening.

18. The display apparatus of claim 16, wherein the area of the bank opening when viewed from the direction perpendicular to the first substrate is greater than or equal to the area of the filter opening.

19. The display apparatus of claim 18, wherein a distance between an edge of the bank opening and the edge of the pixel opening when viewed from the direction perpendicular to the first substrate is greater than or equal to about 6 μm and less than or equal to about 10 μm.

20. The display apparatus of claim 19, wherein the distance between the edge of the bank opening and the edge of the pixel opening is constant along the edge of the pixel opening.

21. The display apparatus of claim 16, wherein the area of the bank opening when viewed from the direction perpendicular to the first substrate is greater than the area of the filter opening.

22. The display apparatus of claim 21, wherein a distance between an edge of the bank opening and the edge of the pixel opening when viewed from the direction perpendicular to the first substrate is greater than about 6 μm and less than or equal to about 10 μm.

23. The display apparatus of claim 22, wherein the distance between the edge of the bank opening and the edge of the pixel opening is constant along the edge of the pixel opening.

24. The display apparatus of claim 16, wherein the distance between the edge of the filter opening and the edge of the pixel opening is greater than or equal to about 6 μm and less than or equal to about 8 μm.

* * * * *